(12) United States Patent
Kang et al.

(10) Patent No.: US 9,324,850 B2
(45) Date of Patent: Apr. 26, 2016

(54) INTEGRATED CIRCUIT DEVICES AND FABRICATING METHOD THEREOF

(71) Applicant: SAMSUNG ELECTRONICS CO., LTD., Suwon-si, Gyeonggi-do (KR)

(72) Inventors: Myung-Gil Kang, Seoul (KR);
Sung-Bong Kim, Suwon-si (KR);
Chang-Woo Oh, Suwon-si (KR);
Dong-Won Kim, Seongnam-si (KR)

(73) Assignee: SAMSUNG ELECTRONICS CO., LTD., Suwon-si, Gyeonggi-do (KR)

(*) Notice: Subject to any disclaimer, the term of this patent is extended or adjusted under 35 U.S.C. 154(b) by 0 days.

(21) Appl. No.: 14/162,052

(22) Filed: Jan. 23, 2014

(65) Prior Publication Data

US 2014/0239255 A1 Aug. 28, 2014

(30) Foreign Application Priority Data

Feb. 26, 2013 (KR) .................. 10-2013-0020612

(51) Int. Cl.
*H01L 29/775* (2006.01)
*H01L 27/088* (2006.01)
*H01L 29/78* (2006.01)
*H01L 29/66* (2006.01)
*H01L 29/06* (2006.01)
*H01L 21/84* (2006.01)
*H01L 27/12* (2006.01)

(52) U.S. Cl.
CPC ............ *H01L 29/775* (2013.01); *H01L 21/845* (2013.01); *H01L 27/0886* (2013.01); *H01L 27/1211* (2013.01); *H01L 29/0673* (2013.01); *H01L 29/66439* (2013.01); *H01L 29/785* (2013.01); *H01L 29/7848* (2013.01)

(58) Field of Classification Search
CPC .................. H01L 29/78624; H01L 29/78609; H01L 21/02603; H01L 21/845; H01L 29/775; H01L 21/0886; H01L 29/7848; H01L 27/1211; H01L 29/0673; H01L 29/785; H01L 29/66439
See application file for complete search history.

(56) References Cited

U.S. PATENT DOCUMENTS

| | | | | |
|---|---|---|---|---|
| 6,066,881 | A * | 5/2000 | Shimizu et al. | 257/392 |
| 7,384,850 | B2 * | 6/2008 | Ahn et al. | 438/275 |
| 7,638,843 | B2 | 12/2009 | Xiong et al. | |
| 7,892,932 | B2 * | 2/2011 | Cheng et al. | 438/300 |
| 7,902,035 | B2 | 3/2011 | Yu et al. | |
| 8,796,759 | B2 * | 8/2014 | Perng et al. | 257/328 |
| 8,901,630 | B2 * | 12/2014 | Huh et al. | 257/296 |
| 2005/0215014 | A1 * | 9/2005 | Ahn et al. | 438/275 |
| 2007/0132000 | A1 | 6/2007 | Hsu et al. | |
| 2007/0145487 | A1 | 6/2007 | Kavalieros et al. | |
| 2008/0230852 | A1 * | 9/2008 | Yu et al. | 257/401 |
| 2009/0121256 | A1 * | 5/2009 | Shin | 257/190 |
| 2009/0246921 | A1 * | 10/2009 | Cheng et al. | 438/221 |

(Continued)

FOREIGN PATENT DOCUMENTS

KR 10-2011-0049090 A 5/2011

*Primary Examiner* — Latanya N Crawford
(74) *Attorney, Agent, or Firm* — Lee & Morse, P.C.

(57) ABSTRACT

An integrated circuit device includes a first transistor having a first channel between a first source/drain, and a second transistor having a second channel between a second source/drain. The first transistor operates based on a first amount of current and the second transistor operates based on a second amount of current different from the first amount of current. The first and second channels have fixed channel widths. The fixed channel widths may be based on fins or nanowires included in the first and second transistors.

14 Claims, 29 Drawing Sheets

(56) References Cited

U.S. PATENT DOCUMENTS

| | | |
|---|---|---|
| 2011/0065244 A1 | 3/2011 | Chang et al. |
| 2011/0291188 A1 | 12/2011 | Cheng et al. |
| 2012/0007185 A1 | 1/2012 | Yin et al. |
| 2012/0009753 A1 | 1/2012 | Matsumoto |
| 2012/0129311 A1 | 5/2012 | Pal et al. |
| 2013/0134520 A1* | 5/2013 | Maeda et al. ............... 257/368 |
| 2013/0256770 A1* | 10/2013 | Huh et al. .................. 257/296 |
| 2013/0285143 A1* | 10/2013 | Oh et al. ................... 257/347 |
| 2013/0285153 A1* | 10/2013 | Lee et al. ................... 257/369 |
| 2014/0048874 A1* | 2/2014 | Zhang et al. ............... 257/336 |
| 2014/0246696 A1* | 9/2014 | Flachowsky et al. ....... 257/190 |

* cited by examiner

INTEGRATED CIRCUIT DEVICES AND FABRICATING METHOD THEREOF

CROSS-REFERENCE TO RELATED APPLICATION

Korean Patent Application No. 10-2013-0020612, filed on Feb. 26, 2013, and entitled, "Integrated Circuit Devices and Fabricating Method Thereof," is incorporated by reference herein in its entirety.

BACKGROUND

1. Field

One or more embodiments described herein relate to integrated circuit devices.

2. Description of the Related Art

Scaling techniques have been proposed for increasing the density of integrated circuit devices. One technique involves the use of a multi-gate transistor. Such a transistor may include a fin- or nanowire-shaped silicon body on a substrate. A gate is then formed on a surface of the silicon body.

Because a multi-gate transistor uses a three-dimensional (3D) channel, scaling may be achieved. In addition, current controlling capability can be improved without increasing a gate length of the multi-gate transistor. Further, a short channel effect (SCE), in which an electric potential of a channel region is affected by a drain voltage, can be effectively suppressed.

SUMMARY

In accordance with one embodiment, an integrated circuit device includes a first fin-shaped transistor; and a second fin-shaped transistor, wherein first source/drain of the first fin-shaped transistor has a first thickness, and wherein second source/drain of the second fin-shaped transistor has a second thickness different from the first thickness.

Also, a distance ranging from a first bottom of a first fin of the first fin-shaped transistor to a first interface between the first fin and the first source/drain corresponds to a first distance, a distance ranging from a second bottom of a second fin of the second fin-shaped transistor to a second interface between the second fin and second source/drain corresponds to a second distance, and the first distance and the second distance are different.

Also, the first source/drain and the second source/drain may have substantially a same first lattice constant, and a first stress applied by the first source/drain to a first channel of the first fin-shaped transistor is different from a second stress applied by the second source/drain to a second channel of the second fin-shaped transistor. The first channel and the second channel may have substantially a same second lattice constant different from the first lattice constant.

Also, the first fin-shaped transistor and the second fin-shaped transistor may be PMOS transistors, the first source/drain and the second source/drain may include SiGe, and the first channel and the second channel may include Si.

Also, the first fin-shaped transistor and the second fin-shaped transistor may be NMOS transistors, and the first source/drain and the second source/drain may include SiC, the first channel and the second channel including Si.

Also, an impurity concentration of the first source/drain may be different from an impurity concentration of the second source/drain.

In accordance with another embodiment, an integrated circuit device includes a substrate having a first region and a second region; a first fin-shaped transistor in the first region and including a first fin, a first gate electrode on and intersecting the first fin, first recesses on the first fin and at respective sides of the first gate electrode, and first source/drain in respective ones of the first recess; and a second fin-shaped transistor in the second region, the second fin-shaped transistor including a second fin, a second gate electrode intersecting the second fin on the second fin, second recesses on the second fin and at respective sides of the second gate electrode, and second source/drain in respective ones of the second recess, wherein the first source/drain has a first thickness and the second sources/drain has a second thickness different from the first thickness.

In accordance with another embodiment, an integrated circuit device includes a substrate having a first block and a second block; at least one first fin-shaped transistor in the first block; and at least one second fin-shaped transistor in the second block, wherein the first source/drain of the first fin-shaped transistor has a first thickness and wherein the second source/drain of the second fin-shaped transistor has a second thickness different from the first thickness.

In accordance with another embodiment, an integrated circuit device includes a substrate having a logic region and an SRAM region; a first fin-shaped transistor in the logic region, the first fin-shaped transistor including a first fin, first recesses on respective sides of the first fin, and first source/drain in respective ones of the first recesses; and a second fin-shaped transistor in the SRAM region, the second fin-shaped transistor including a second fin, second recesses on respective sides of the second fin, and second source/drain formed in respective ones of the second recesses, wherein a depth of the first recess is different from a depth of the second recess.

In accordance with another embodiment, an integrated circuit device includes a first nanowire-shaped transistor on a substrate, and a second nanowire-shaped transistor on the substrate, wherein a first thickness of a first source/drain of the first nanowire-shaped transistor is different from a second thickness of a second source/drain of the second nanowire-shaped transistor.

In accordance with another embodiment, an a first nanowire-shaped transistor on a substrate and a second nanowire-shaped transistor on the substrate, wherein the first nanowire-shaped transistor includes multiple first nanowires stacked vertically and a first source/drain electrically connected to n first nanowires among the multiple first nanowires, where n is a natural number, and wherein the second nanowire-shaped transistor includes multiple second nanowires stacked vertically and a second source/drain electrically connected to m second nanowires among the multiple second nanowires, where m is a natural number.

The n first nanowires may be n first nanowires sequentially arranged from the topmost first nanowire, and the m second nanowires may be second nanowires sequentially arranged from the topmost second nanowire. The multiple first nanowires may be k first nanowires stacked one on another, and the multiple second nanowires may be second nanowires stacked one on another, where k is a natural number.

In accordance with another embodiment, a method of making an integrated circuit device includes providing a substrate having a first region and a second region; forming a first fin in the first region and forming a second fin in the second region; forming a first gate electrode intersecting the first fin in the first region and forming a second gate electrode intersecting the second fin in the second region, and forming a first recess in the first fin at either side of the first gate electrode in the first region and forming a second recess in the second fin at either side of the second gate electrode in the second region, wherein a depth of the first recess is different from a depth of the second recess.

In accordance with another embodiment, a device includes a first transistor having a first channel between first source/drain; and a second transistor having a second channel between second source/drain; wherein the first and second channels have fixed channel widths, and wherein the first transistor operates based on a first amount of current and the second transistor operates based on a second amount of current different from the first amount of current.

The first transistor may include a first fin including the first channel, and the second transistor may include a second fin including a second channel. The first source/drain may apply a first force to the first channel in the first fin, the second source/drain may apply a second force to the second channel in the second fin, wherein the first force is different from the second force, and wherein a difference between the first and second forces corresponding to a difference between the first and second amounts of current.

The first source/drain may apply the first force to the first channel based on a first impurity concentration, and the second source/drain may apply the second force to the second channel based on a second impurity concentration different from the first impurity concentration.

The first source/drain may apply the first force to the first channel based on a first size of the first source/drain, and the second source/drain may apply the second force to the second channel based on a second size of the second source/drain different from the first size. The first and second sizes may be different thicknesses.

The first transistor may have a first number of first fins, and the second transistor may have a second number of second fins different from the first number of fins, wherein the first number is at least one and wherein the first number of fins corresponds to the first amount of current and the second number of fins corresponds to a second amount of current.

The first transistor may have a first number of nanowires which includes the first channel, and the second transistor may have a second number of nanowires which includes a second channel, wherein the first number of nanowires is at least one and wherein the first amount of current based on the first number of nanowires and the second amount of current based on the second number of nanowires.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
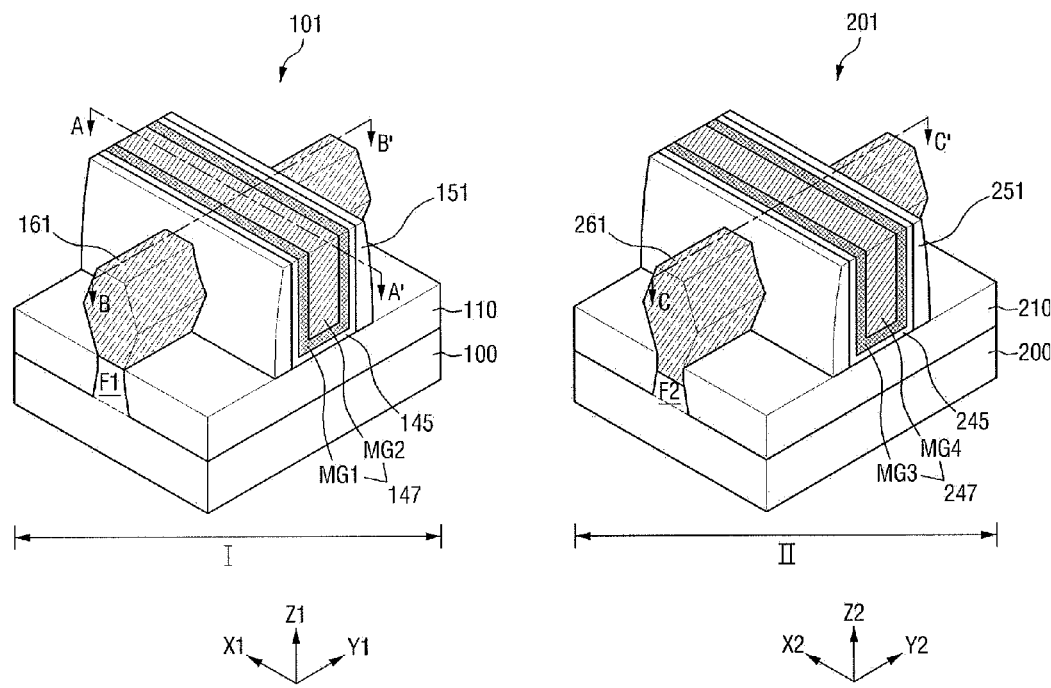
FIG. 1 illustrates a first embodiment of an integrated circuit device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
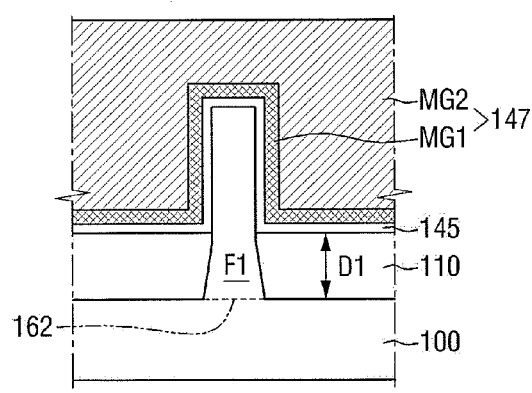
FIG. 2 illustrates a view along section line A-A in FIG. 1.
Figure 3:
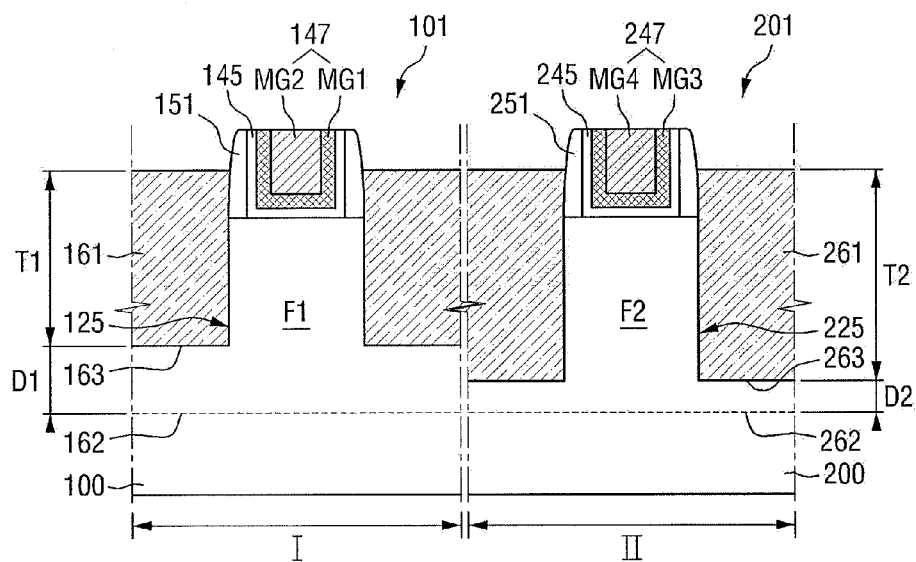
FIG. 3 illustrates a view along section lines B-B and C-C in FIG. 1.

FIG. 1 illustrates a first embodiment of an integrated circuit device, FIG. 2 illustrates a cross-sectional view taken along line A-A of FIG. 1, and FIG. 3 illustrates a cross-sectional view taken along lines B-B and C-C of FIG. 1.

Referring to FIGS. 1 to 3, a first fin-shaped transistor 101 is formed in a first region I, and a second fin-shaped transistor 201 is formed in a second region II. The first region I and the second region II may be regions spaced apart from each other or connected to each other. For example, the first region I may be an SRAM region, and the second region II may be a logic region. Alternatively, the first region I may be a region where a pull-up transistor of SRAM is formed, and the second region II may be a region where a pull-down transistor of a RAM or a pass transistor is formed.

Stress applied to a channel of the first fin-shaped transistor 101 and stress applied to a channel of the second fin-shaped transistor 201, are different from each other. When appropriate stress is applied to a channel, the mobility of carriers may be improved and the amount of current may be increased. An amount of strain applied to a channel may vary according to how close to the channel the stress is applied. In this embodiment, in order to adjust the magnitude of applied stress, a first thickness T1 of a first source/drain 161 of the first fin-shaped transistor 101 and a second thickness T2 of a second source/drain 261 of the second fin-shaped transistor 201 are adjusted to be different from each other.

The first fin-shaped transistor 101 may include a first fin F1, a first gate electrode 147, a first recess 125, and a first source/drain 161. The first fin F1 may extend lengthwise in a second direction Y1. The first fin F1 may include part of the substrate 100 and may include an epitaxial layer grown from the substrate 100. An isolation film 110 may cover side surfaces of the first fin F1.

The first gate electrode 147 may be formed on the first fin F1, for example, to intersect the first fin F1. The first gate electrode 147 may extend in a first direction X1.

The first gate electrode 147 may include metal layers MG1 and MG2. As shown, the first gate electrode 147 may include two or more metal layers MG1 and MG2. The first metal layer MG1 may function to adjust a work function, and the second metal layer MG2 may function to fill a space formed by the first metal layer MG1. For example, the first metal layer MG1 may include at least one of TiN, TaN, TiC, or TaC. The second metal layer MG2 may include W or Al. Alternatively, the first gate electrode 147 may include a material other than a metal, such as Si or SiGe. The first gate electrode 147 may be formed by, for example, a replacement process. That is, the first gate electrode 147 may have a gate last structure. The first gate electrode 147 may have, for example, a gate first structure.

The first gate insulation layer 145 may be formed between the first fin F1 and the first gate electrode 147. As shown FIG. 2, the first gate insulation layer 145 may be formed on a top surface and upper portions of side surfaces of the first fin F1. In addition, the first gate insulation layer 145 may be disposed between the first gate electrode 147 and the isolation film 110. The first gate insulation layer 145 may include a high-k material having a higher dielectric constant than silicon oxide. For example, the first gate insulation layer 145 may include HfO2, ZrO2 or Ta2O5.

The first recess 125 may be formed in the first fin F1 at either side of the first gate electrode 147. The first source/drain 161 is formed in the first recess 125 and may be an elevated source/drain. The first source/drain 161 and the first gate electrode 147 may be insulated from each other by a spacer 151. The spacer 151 may include at least one of nitride or oxynitride.

In a case where the first fin-shaped transistor 101 is a PMOS transistor, the first source/drain 161 may include a compressive stress material. For example, the compressive stress material may be a material having a larger lattice constant than silicon (Si), for example, SiGe. The compressive stress material may improve the mobility of carriers of a channel region by applying compressive stress to the first fin F1.

However, in a case where the first fin-shaped transistor 101 is an NMOS transistor, the first source/drain 161 may include the same material as the substrate 100 or a tensile stress material. For example, when the substrate 100 includes Si, the first source/drain 161 may include Si or a material having a smaller lattice constant than Si (e.g., SiC).

The substrate 100 may include one or more semiconductor materials selected from the group consisting of Si, Ge, SiGe, GaP, GaAs, SiC, SiGeC, InAs and InP. Alternatively, the substrate 100 may a silicon on insulator (SOI) substrate.

The second fin-shaped transistor 201 may include a second fin F2, a second gate electrode 247, a second recess 225, and a second source/drain 261. The second gate electrode 247 may be formed on the second fin F2, for example, to intersect the second fin F2. The second recess 225 may be formed in the second fin F2 at either side of the second gate electrode 247. The second source/drain 261 may be formed in the second recess 225. The second fin-shaped transistor 201 may be similar to the first fin-shaped transistor 101, except for certain differences as described herein.

In FIG. 1, for the sake of convenient explanation, the first fin F1 and the second fin F2 are illustrated to extend lengthwise in second directions Y1 and Y2 to be parallel to each other. In other embodiments, the fins may not be parallel. For example, the first fin F1 may extend lengthwise in the second direction Y1, and the second fin F2 may extend lengthwise in the first direction X2.

Likewise, the first gate electrode 147 and the second gate electrode 247 are illustrated to extend lengthwise in the first directions X1 and X2 to be parallel to each other. In other embodiments, the gate electrodes may not be parallel. For example, the first gate electrode 147 may extend lengthwise in the first direction X1, and the second gate electrode 247 may extend lengthwise in the second direction Y2.

The first fin-shaped transistor 101 and the second fin-shaped transistor 201 may have the same conductivity type (e.g., a P or an N type). Alternatively, the first fin-shaped transistor 101 may be of a first conductivity type (e.g., a P type) and the second fin-shaped transistor 201 may be of a second conductivity type (e.g., an N type).

In the figures, reference numeral 201 may denote a substrate, reference numeral 245 may denote a second gate insulation layer, reference numeral 251 may denote a second spacer, reference symbol MG3 may denote a third metal layer, and reference symbol MG4 may denote a fourth metal layer.

The first recess 125 and the second recess 225 may be filled with metal, instead of a semiconductor material. That is to say, the first source/drain 161 and the second source/drain 261 may include a metallic material, not a semiconductor material, such as Si, SiGe or SiC.

Referring to FIG. 3, as described above, the first thickness T1 of the first source/drain 161 of the first fin-shaped transistor 101 is different from the second thickness T2 of the second source/drain 261 of the second fin-shaped transistor 201. As shown in FIG. 3, the first thickness T1 may be smaller than the second thickness T2.

In other words, a first distance D1 refers to a distance ranging from a first bottom 162 of the first fin F1 of the first fin-shaped transistor 101 to a first interface 163 between the first fin F1 and the first source/drain 161. A second distance D2 refers to a distance ranging from a second bottom 262 of the second fin F2 of the second fin-shaped transistor 201 to a second interface 263 between the second fin F2 and the second source/drain 261. The first distance D1 and second distance D2 may be different from each other. Here, the term "distance ranging from a to b" means the shortest distance between a and b. As shown, the second distance D2 may be shorter than the first distance D1.

In other words, a depth of the first recess 125 of the first fin-shaped transistor 101 and a depth of the second recess 225 of the second fin-shaped transistor 201 may be different from each other. The first source/drain 161 may be formed in the first recess 125 and the second source/drain 261 may be formed in the second recess 225. Therefore, if the first recess 125 and the second recess 225 are formed to have different depths, the first thickness T1 of the first source/drain 161 may be different from the second thickness T2 of the second source/drain 261.

The isolation film 110 may have a thickness D1 (see FIG. 2). As shown, the first recess 125 may be formed to reach a top surface of the isolation film 110 and the second recess 225 may be formed to be deeper than the top surface of the isolation film 110. The second recess 225 is deeper than the first recess 125.

For example, when the first fin-shaped transistor 101 and the second fin-shaped transistor 201 are both P-type transistors, the substrate 100 may include Si and the first source/drain 161 and the second source/drain 261 may include SiGe. In this case, since SiGe has a larger lattice constant than Si, the first source/drain 161 may apply compressive stress to a channel of the first fin-shaped transistor 101 and the second source/drain 261 may apply compressive stress to a channel of the second fin-shaped transistor 201.

However, since the first thickness T1 of the first source/drain 161 is smaller than the second thickness T2 of the second source/drain 261, a volume of the first source/drain 161 is smaller than that of the second source/drain 261. Therefore, the compressive stress applied from the first source/drain 161 to the channel of the first fin-shaped transistor 101 may be smaller than the compressive stress applied from the second source/drain 261 to the channel of the second fin-shaped transistor 201. Therefore, a driving current amount of the first fin-shaped transistor 101 may be greater than that of the second fin-shaped transistor 201.

In a case of a fin having a very small width (e.g., 20 nm or less), the fin may not be formed using a general photo process. A sidewall image transfer (SIT) process, for example, may be used for a fin having a predetermined width is repeatedly formed. In this case, it is difficult to effectively adjust a channel width. That is to say, in a case of a general planar transistor, it is easy to control the current amount by varying the channel width. However, in a case of a fin-shaped transistor using a fin formed through the SIT process, it may be more difficult to control the current amount because the fin has a fixed channel width.

In the integrated circuit device according to the first embodiment, the current amounts of the fin-shaped transistors 101 and 201 can be easily controlled by adjusting the thicknesses T1 and T2 of the first and second sources/drains 161 and 261.

Figure 4:
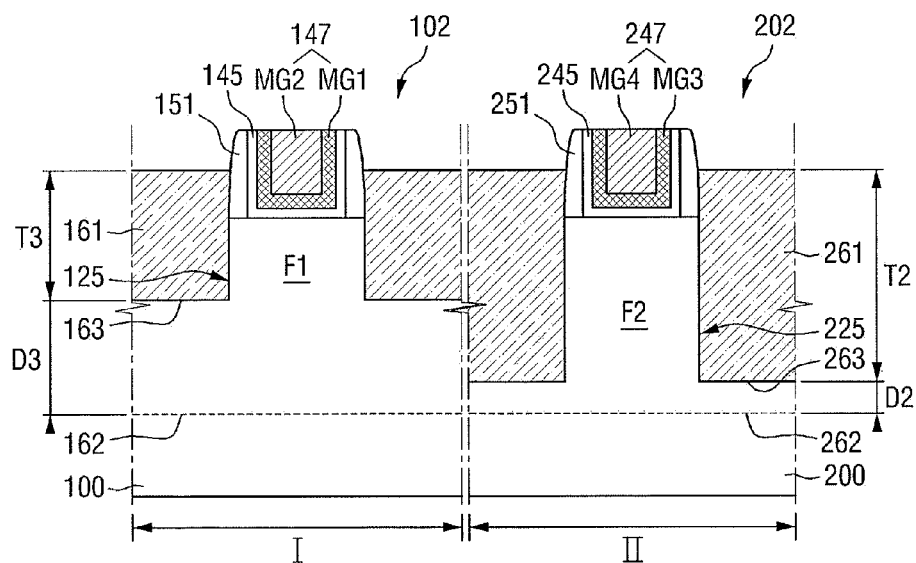
FIG. 4 illustrates a second embodiment of an integrated circuit device.

FIG. 4 illustrates a cross-sectional view of a second embodiment of an integrated circuit device. This embodiment may be similar to the aforementioned embodiment, except for several differences noted as follows.

Referring to FIG. 4, assuming that an isolation film 110 has a thickness D1 (see FIG. 2), a first recess 125 is formed to extend over a top surface of the isolation film 110, and a second recess 225 may be formed to be deeper than the top surface of the isolation film 110. The second recess 225 may be formed to be deeper than the first recess 125.

A third thickness T3 of the first source/drain 161 of the first fin-shaped transistor 102 may be different from the second thickness T2 of the second source/drain 261 of the second fin-shaped transistor 202. The third thickness T3 may be smaller than the first thickness T1 (see FIG. 3).

A third distance D3 refers to a distance ranging from a first bottom 162 of a first fin F1 of a first fin-shaped transistor 102 to a first interface 163 between the first fin F1 and a first source/drain 161. A second distance D2 refers to a distance ranging from a second bottom 262 of a second fin F2 of a second fin-shaped transistor 202 to a second interface 263 between the second fin F2 and a second source/drain 261. The third distance D3 and the second distance D2 may be different from each other. In addition, the third distance D3 may be longer than the first distance D1 (see FIG. 3).

Figure 5:
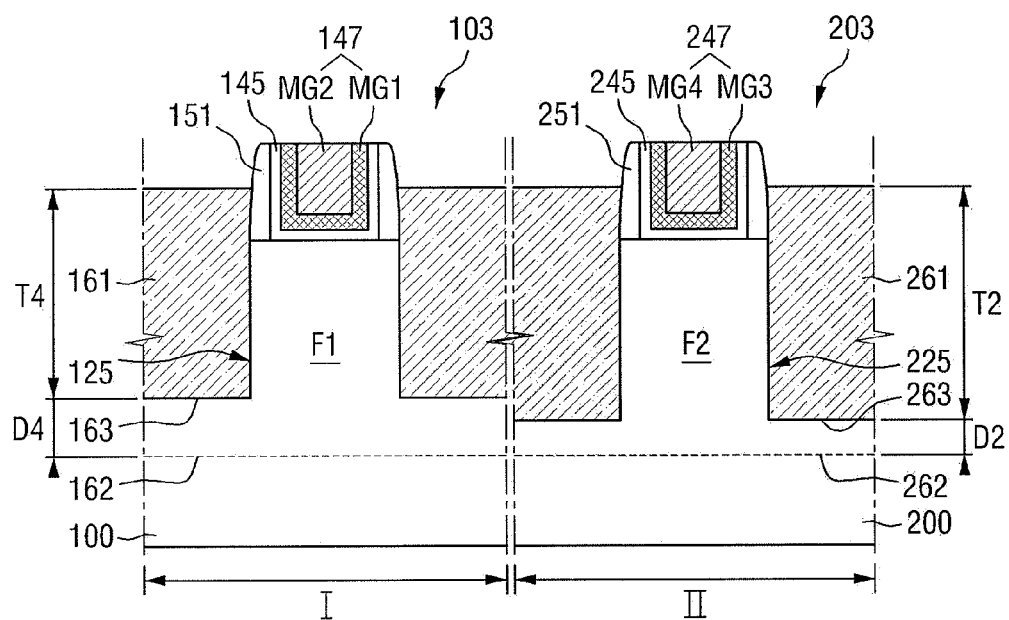
FIG. 5 illustrates a third embodiment of an integrated circuit device.

FIG. 5 illustrates a cross-sectional view of a third embodiment of an integrated circuit device. Referring to FIG. 5, assuming that an isolation film 110 has a thickness D1 (see FIG. 2), both of a first recess 125 and a second recess 225 may be formed to be deeper than a top surface of the isolation film 110. In addition, the second recess 225 is deeper than the first recess 125.

A fourth thickness T4 and a second thickness T2 may be different from each other. The fourth thickness T4 may be larger than the first thickness T1 (see FIG. 3). However, the fourth thickness T4 may be smaller than the second thickness T2.

A fourth distance D4 and a second distance D2 may be different from each other. The fourth distance D4 may be smaller than the first distance D1 (see FIG. 3). In addition, the fourth distance D4 may be larger than the second distance D2.

Figure 6:
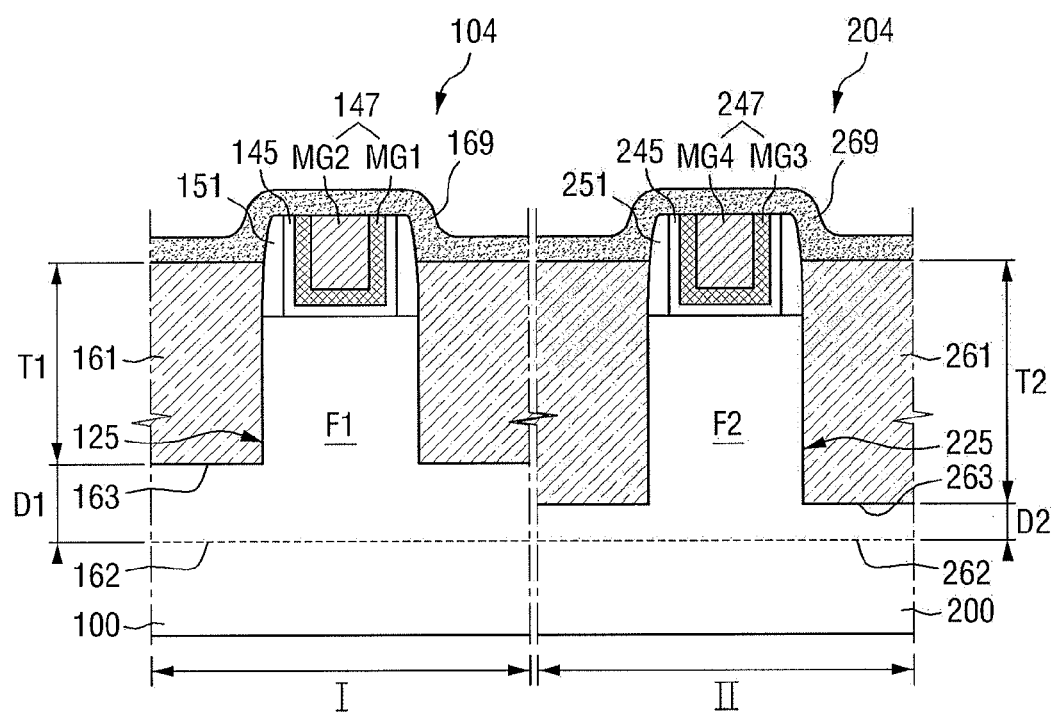
FIG. 6 illustrates a fourth embodiment of an integrated circuit device.

FIG. 6 illustrates a cross-sectional view of a fourth embodiment of an integrated circuit device. Referring to FIG. 6, a first stress layer 169 may be formed on a first fin-shaped transistor 104 and a second stress layer 269 may be formed on a second fin-shaped transistor 204. The stress layers 169 and 269 may be, for example, SiN layers. In the case where SiN layers are used, the type of stress applied by the stress layers 169 and 269 to the channel may be determined according to the N—H to Si—H bonding ratio in the SiN layer. For example, if the N—H bonding/Si—H bonding ratio is in a range of 1 to 5, the SiN layer may apply tensile stress. If the N—H bonding/Si—H bonding ratio is in a range of 5 to 20, the SiN layer may apply compressive stress.

For example, when the first fin-shaped transistor 104 and the second fin-shaped transistor 204 are both PMOS transistors, a driving current amount of the second fin-shaped transistor 202 may be greater than that of the first fin-shaped transistor 102. The current amounts of the first fin-shaped transistor 102 and the second fin-shaped transistor 202 may also be increased due to the first stress layer 169 and the second stress layer 269.

Figure 7:
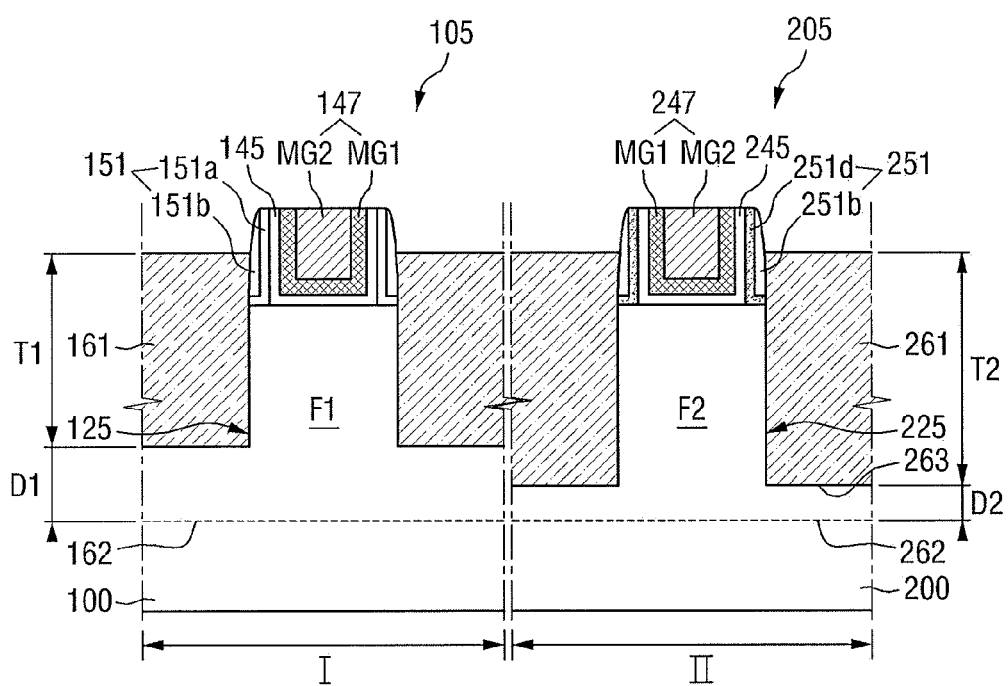
FIG. 7 illustrates a fifth embodiment of an integrated circuit device.

FIG. 7 illustrates a cross-sectional view of a fifth embodiment of an integrated circuit device. Referring to FIG. 7, stress applied from a first spacer 151 to a channel of a first fin-shaped transistor 105 and stress applied from a second spacer 251 to a channel of a second fin-shaped transistor 205 may be different from each other. In one embodiment, the materials used to form the first spacer 151 and the second spacer 251 may be different from each other. For example, insulating layers 151a and 151b of the first spacer 151 and an insulating layer 251b of the second spacer 251 may be materials which do not apply stress to a channel. However, the second spacer 251d may be a material applying stress to a channel of the second fin-shaped transistor 203a. As the result, the driving current amounts of the first fin-shaped transistor 105 and the second fin-shaped transistor 205 may be controlled to be different from each other.

Figure 8:
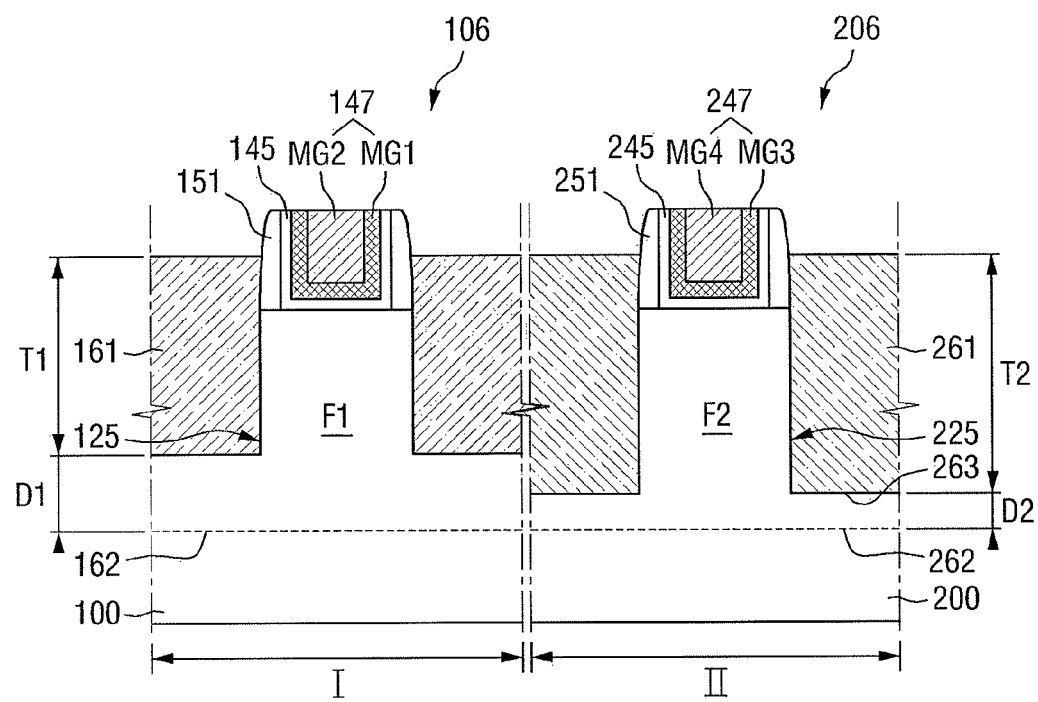
FIG. 8 illustrates a sixth embodiment of an integrated circuit device.

FIG. 8 illustrates a cross-sectional view of a sixth embodiment of an integrated circuit device. Referring to FIG. 8, a first fin-shaped transistor 106 and a second fin-shaped transistor 206 may be of the same conductivity type. An impurity concentration of a first source/drain 161 formed in a first recess 125 and an impurity concentration of a second source/drain 261 formed in a second recess 225 may be different from each other. For example, if the impurity concentration of the second source/drain 261 is greater than that of the first source/drain 161, resistance of the second source/drain 261 may be smaller than resistance of the first source/drain 161. Therefore, a driving current amount of the second fin-shaped transistor 206 may be greater than that of the first fin-shaped transistor 106. That is to say, the driving current amounts can be controlled by adjusting the impurity concentrations of the first and second sources/drains 161 and 261.

Figure 9A:
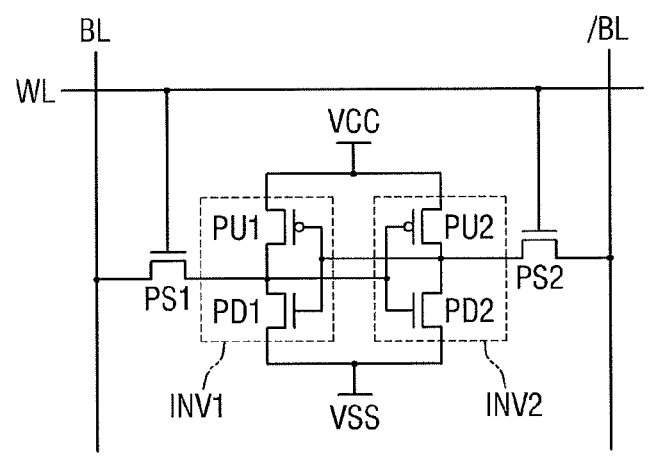
FIGS. 9A and 9B illustrate a circuit view and a layout view for explaining an integrated circuit device according to a seventh embodiment.
Figure 9B:
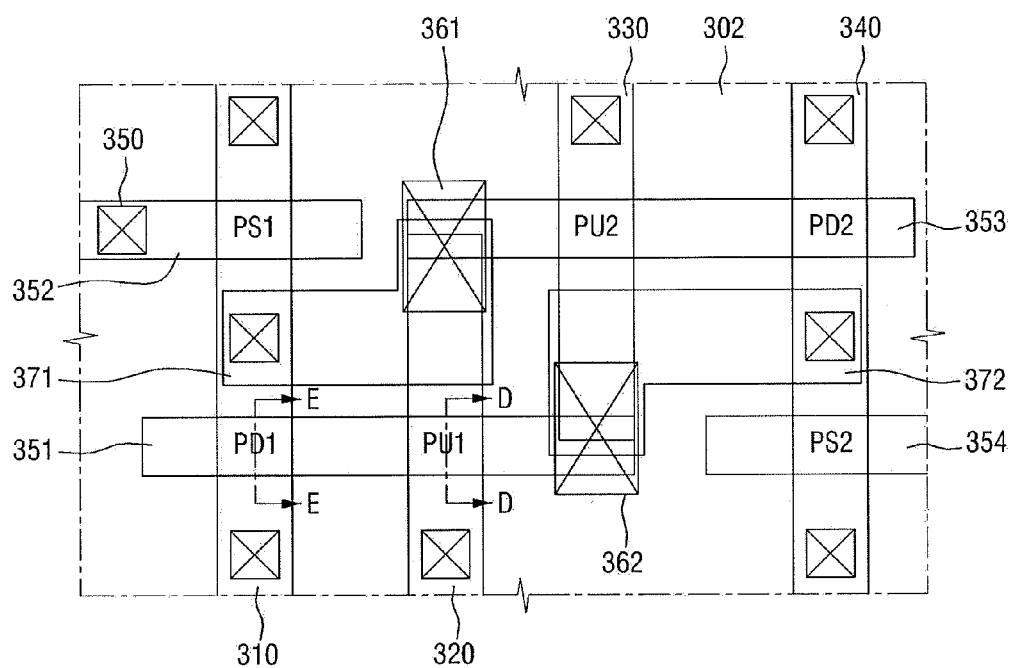
Figure 9C:
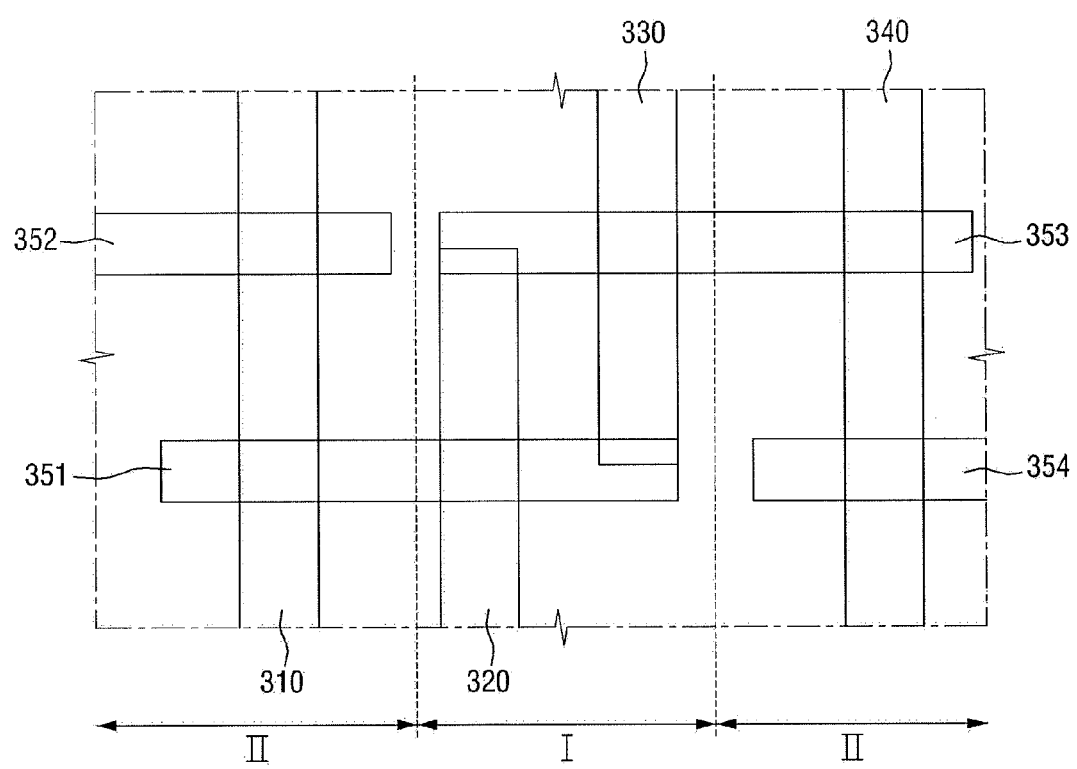
FIG. 9C illustrates only multiple fins and multiple gate electrodes from the layout view of FIG. 9B.
Figure 9D:
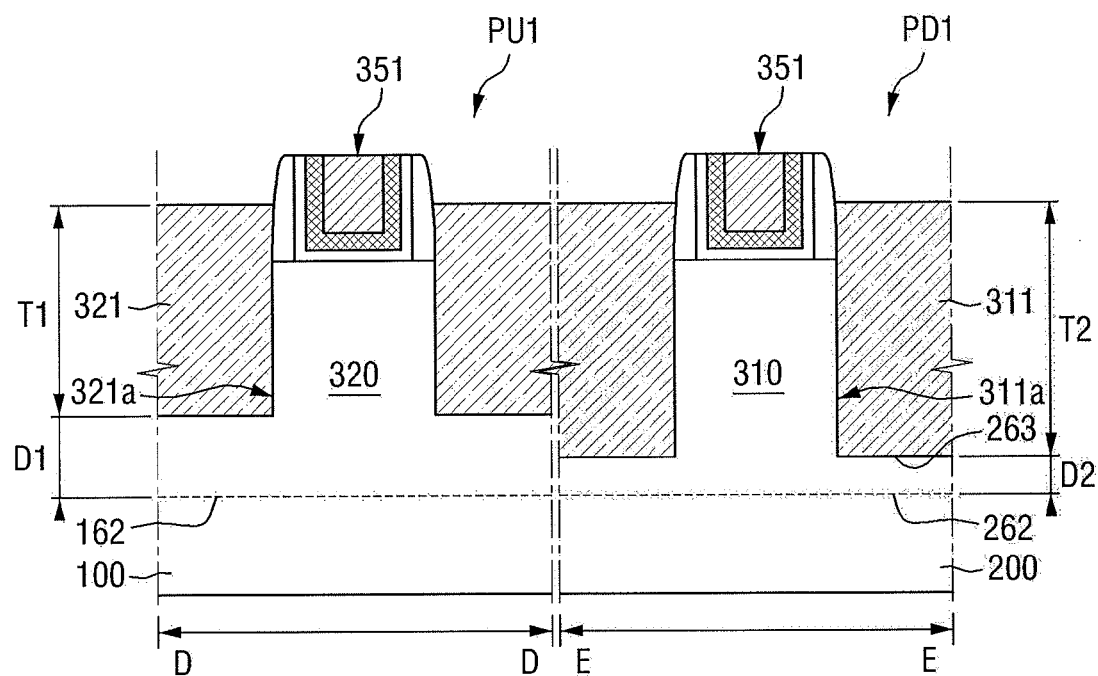
FIG. 9D illustrates a cross-sectional view along section lines D-D and E-E of FIG. 9B.

FIGS. 9A and 9B illustrate a circuit view and a layout view corresponding to a seventh embodiment of an integrated circuit device. FIG. 9C illustrates only multiple fins and multiple gate electrodes from the layout view of FIG. 9B. FIG. 9D illustrates a cross-sectional view taken along the lines D-D and E-E of FIG. 9B. The above-described embodiments of integrated circuit devices may be applied to all devices using fin-shaped transistors. The embodiments illustrated in FIGS. 9A to 9D may be applied to various devices, on example of which is an SRAM.

First, referring to FIG. 9A, the integrated circuit device includes a pair of inverters INV1 and INV2 connected in parallel between a power supply node Vcc and a ground node Vss The device also includes a first pass transistor PS1 and a second pass transistor PS2 connected to output nodes of the respective inverters INV1 and INV2. The first pass transistor PS1 and the second pass transistor PS2 may be connected to a bit line BL and a complementary bit line BL/, respectively. Gates of the first pass transistor PS1 and the second pass transistor PS2 may be connected to a word line WL.

The first inverter INV1 includes a first pull-up transistor PU1 and a first pull-down transistor PD1 connected in series to each other. The second inverter INV2 includes a second pull-up transistor PU2 and a second pull-down transistor PD2 connected in series with each other. The first pull-up transistor PU1 and the second pull-up transistor PU2 may be PMOS transistors, and the first pull-down transistor PD1 and the second pull-down transistor PD2 may be NMOS transistors. In order to constitute a latch circuit, an input node of the first inverter INV1 is connected to an output node of the second inverter INV2, and an input node of the second inverter INV2 is connected to an output node of the first inverter INV1.

Referring to FIGS. 9B to 9D, a first fin 310, a second fin 320, a third fin 330, and a fourth fin 340, which are spaced apart from one another, may extend lengthwise in a predetermined direction (e.g., in an up-and-down direction of FIG. 9). The second fin 320 and the third fin 330 may extend in smaller lengths than the first fin 310 and the fourth fin 340.

A first gate electrode 351, a second gate electrode 352, a third gate electrode 353, and a fourth gate electrode 354 are formed to extend in another direction (for example, in a left-and-right direction of FIG. 9) to intersect the first fin 310 to the fourth fin 340. In one embodiment, the first gate electrode 351 completely intersects the first fin 310 and the second fin 320, while partially overlapping a terminal of the third fin 330. The third gate electrode 353 may completely intersect the fourth fin 340 and the third fin 330, while partially overlapping a terminal of the second fin 320. The second gate electrode 352 and the fourth gate electrode 354 may be formed to intersect the first fin 310 and the fourth fin 340, respectively.

As shown, the first pull-up transistor PU1 is defined in a vicinity of an intersection of the first gate electrode 351 and the second fin 320. The first pull-down transistor PD1 is defined in vicinity of an intersection of the first gate electrode 351 and the first fin 310. The first pass transistor PS1 is defined in a vicinity of an intersection of the second gate electrode 352 and the first fin 310. The second pull-up transistor PU2 is defined in a vicinity of an intersection of the third gate electrode 353 and the third fin 330. The second pull-down transistor PD2 is defined in a vicinity of an intersection of the third gate electrode 353 and the fourth fin 340. The second pass transistor PS2 is defined in a vicinity of an intersection of the fourth gate electrode 354 and the fourth fin 340.

Recesses may be formed at opposite sides of the respective intersections of the first to fourth gate electrodes 351-354. The first to fourth fins 310, 320, 330 and 340, and sources/drains may be formed in the recesses.

In addition, a plurality of contacts 350 may be formed. A shared contact 361 may concurrently connect the second fin 320, a third gate line 353, and an interconnection 371. The shared contact 361 may also concurrently connect the third fin 330, a first gate line 351, and an interconnection 372. For example, the first pull-up transistor PU1, the first pull-down transistor PD1, the first pass transistor PS1, the second pull-up transistor PU2, the second pull-down transistor PD2, and the second pass transistor PS2 may be all implemented by fin-shaped transistors and may have the configuration, for example, as any of those shown in FIGS. 1 to 8.

In an exemplary embodiment, the integrated circuit device may have a configuration shown in FIG. 9D. The first pull-up transistor PU1 may include a second fin 320, a first gate electrode 351 intersecting the second fin 320, a first recess 321a formed in the second fin 320 at either side of the first gate electrode 351, and a first source/drain 321 formed in the first recess 321a. The first pull-down transistor PD1 may include a first fin 310, a first gate electrode 351 intersecting the first fin 310, a second recess 311a formed in the first fin 310 at either side of the first gate electrode 351, and a second source/drain 311 formed in the second recess 311a.

In such a case, a thickness of the first source/drain 321 of the first pull-up transistor PU1 may be different from a thickness of the second source/drain 311 of the first pull-down transistor PD1. For example, in order to reduce current consumption, a current amount of the first pull-up transistor PU1 may be reduced. Therefore, the thickness of the first source/drain 321 of the first pull-up transistor PU1 may be smaller than that of the second source/drain 311 of the first pull-down transistor PD 1.

The first pass transistor PS1 may include a first fin 310, a second gate electrode 352 intersecting the first fin 310, a third recess formed in the first fin 310 at either side of the second gate electrode 352, and a third source/drain formed in the third recess. As shown, the second source/drain and the third source/drain may share a node. A thickness of the first source/drain 321 of the first pull-up transistor PU1 and a thickness of the third source/drain of the first pass transistor PS1 may be different from each other.

Figure 10A:
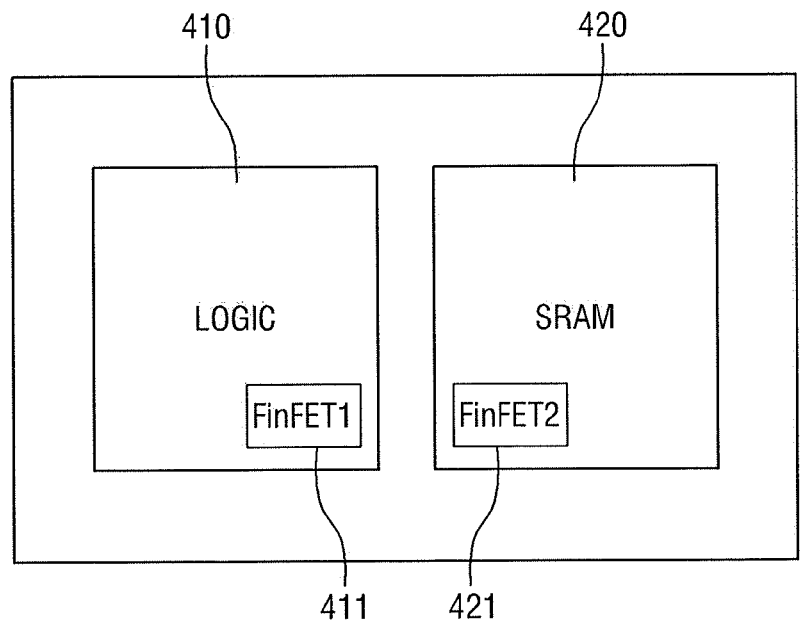
FIGS. 10A to 10C illustrate eighth embodiments of integrated circuit devices.

The recesses of the first pull-up transistor PU1 and the second pull-up transistor PU2 in the first region I and the recesses of the first pull-down transistor PD1, the second pull-down transistor PD2, the first pass transistor PS1, and the second pass transistor PS2 in the second region II may be performed by separate and/or different processes. In such a manner, driving current amounts of the first pull-up transistor PU1 (and/or the second pull-up transistor PU2) can be reduced relative to those of the other transistors PD1, PD2, PS1, and PS FIG. 10A illustrates a conceptual diagram of an integrated circuit device according to a first arrangement (8a-th) of an eighth embodiment. Referring to FIG. 10A, in the integrated circuit device according to the 8a-th embodiment, a fin-shaped transistor 411 may be disposed in a logic region 410 and a fin-shaped transistor 421 may be disposed in an SRAM region 420.

Like in FIGS. 1 to 8, the fin-shaped transistor 411 includes a first fin, a first recess formed in the first fin, and a first source/drain formed in the first recess. The second fin-shaped transistor 421 includes a second fin, a second recess formed in the second fin, and a second source/drain formed in the second recess. A depth of the first recess and a depth of the second recess may be different. In one application, a thickness and/or depth of the first source/drain may be different from a thickness and/or depth of the second source/drain. Also, stress applied to a channel of the fin-shaped transistor 411 and stress applied to a channel of the fin-shaped transistor 421 may be adjusted to be different from each other.

In one application, the depth of the first recess may be greater than that of the second recess. The depths may be set this way because better performance (i.e., a higher speed) may be required by the fin-shaped transistor 411 formed in the logic region 410 than by the fin-shaped transistor 421 formed in the SRAM region 420.

FIG. 10A illustrates an example of the logic region 410 and the SRAM region 420. However, other embodiments may be applied to a region where a different type of memory from the logic region 410 is formed (e.g., DRAM, MRAM, RRAM, PRAM, etc.).

Figure 10B:
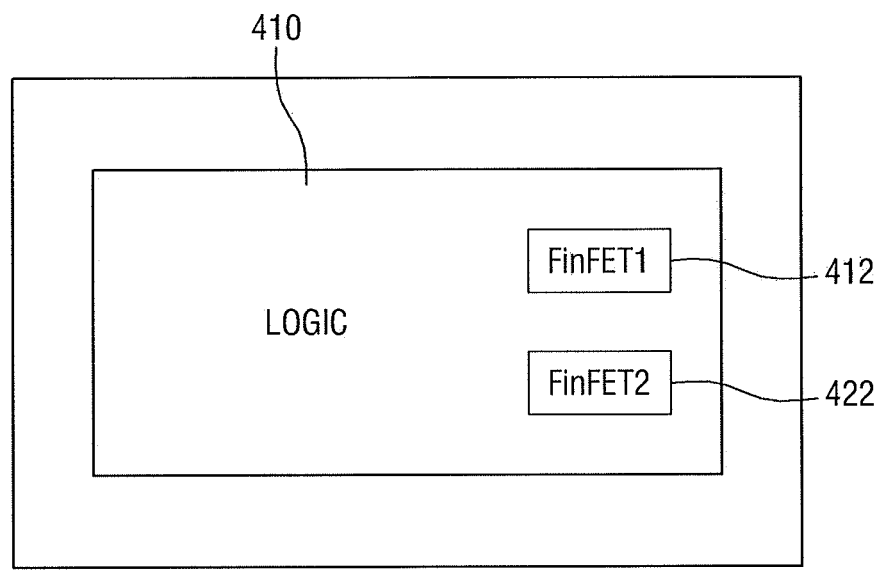

FIG. 10B illustrates a conceptual diagram of a second arrangement (8b-th) of the eighth embodiment of an integrated circuit device. Referring to FIG. 10B, in this arrangement, different fin-shaped transistors 412 and 422 may be disposed in the logic region 410. That is, a thickness of the source/drain of the fin-shaped transistor 412 and a thickness of the source/drain of the fin-shaped transistor 422 may be different from each other. Alternatively, stress applied to a channel of the fin-shaped transistor 412 and stress applied to a channel of the fin-shaped transistor 422 may be adjusted to be different from each other.

Figure 10C:
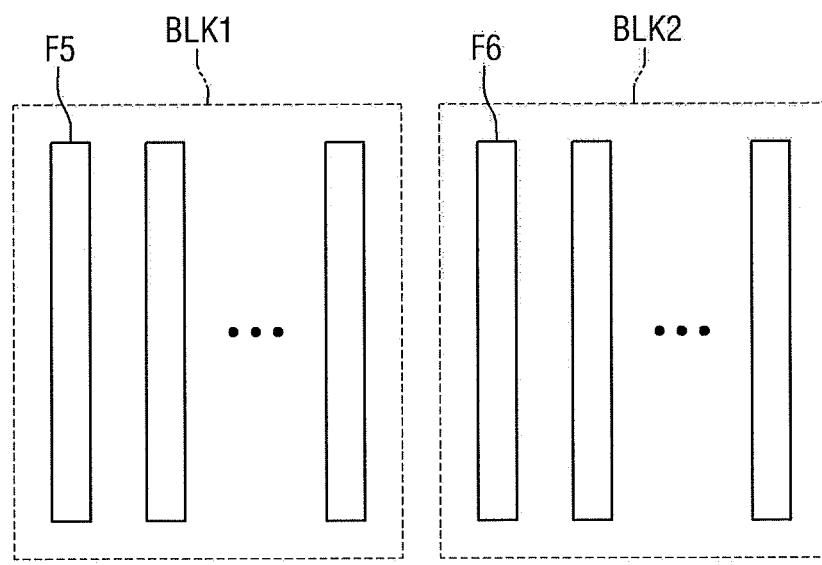

FIG. 10C illustrates a conceptual diagram of a third arrangement (8c-th) of the eighth embodiment of an integrated circuit device. Referring to FIG. 10C, in this arrangement, a plurality of blocks (e.g., BLK1, BLK2, etc.) are defined in a substrate. Different fin-shaped transistors may be provided for the respective blocks BLK1 and BLK2.

Also, as shown in FIG. 10C, one or more fins F5 and F6 may be provided in each of the blocks BLK1 and BLK2. A thickness of the fin-shaped transistor disposed in the block BLK1 and a thickness of the fin-shaped transistor disposed in the block BLK2 may be different from each other. Alternatively, stress applied to a channel of the fin-shaped transistor disposed in the block BLK1 and stress applied to a channel of the fin-shaped transistor disposed in the block BLK2 may be different from each other.

Figure 11A:
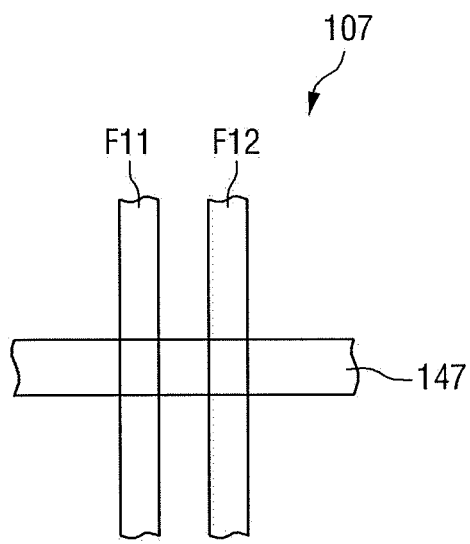
FIGS. 11A and 11B illustrate conceptual diagrams of ninth and tenth embodiments of integrated circuit.
Figure 11A:
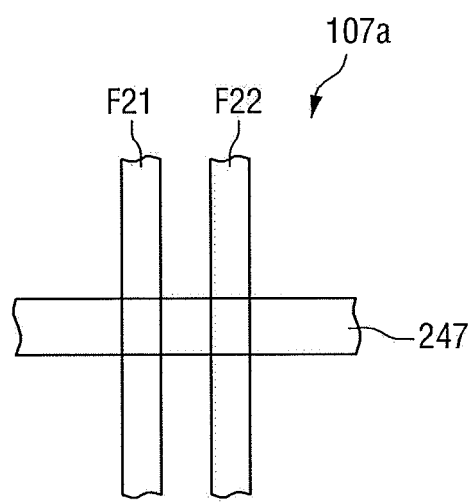

FIG. 11A illustrates a ninth embodiment of an integrated circuit device. In this embodiment, current amounts of fin-shaped transistors 107 and 107a may be controlled by adjusting the number of fins F11, F12, F21 and F22.

The fin-shaped transistor 107 may include a plurality of first fins F11 and F12 spaced apart from and parallel to each other. A first gate electrode 147 may be disposed to intersect the plurality of first fin F1. The fin-shaped transistor 107a may include a plurality of second fins F21 and F22 spaced apart and parallel to each other. A second gate electrode 247 may be disposed to intersect the second fin F2.

A thickness of a source/drain of the fin-shaped transistor 107 and a thickness of a source/drain of the fin-shaped transistor 107a may be made different from each other.

A current amount of the fin-shaped transistor 107 may be increased by increasing the number of fins F11 and F12 used by the fin-shaped transistor 107. For example, consider the case where a current amount of a fin-shaped transistor using one fin is j, a current amount of a fin-shaped transistor using two fins F11 and F12 is equal to 2j. Current amounts of the fin-shaped transistors 107a and 107 may be adjusted to be different from each other by a predetermined amount, e.g., a. For example, the current amount of the fin-shaped transistor 107a may be approximately $2j+\alpha$ or $2j-\alpha$, and the current amount of the fin-shaped transistor 107 may be 2j. According to the ninth embodiment, the fin-shaped transistors 107 and 107a may have various types of current amounts.

Figure 11B:
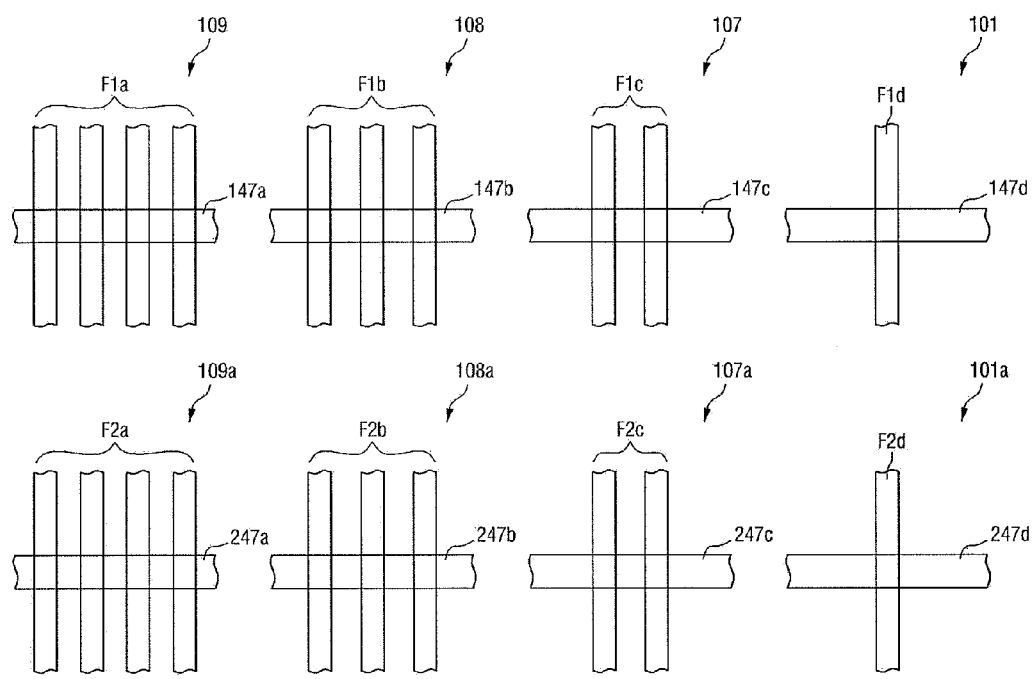

FIG. 11B illustrates a tenth embodiment of an integrated circuit device. In this embodiment, current amounts of fin-shaped transistors 109, 108, 107, and 101 may be controlled by adjusting the number of fins F1a, F1b, F2a, F2b, F3a, F3b, F4a and F4b used by the fin-shaped transistors 109, 108, 107, and 101. The fin-shaped transistors 109 and 109a use four fins F1a and F2a, respectively. Assuming that a current amount of a fin-shaped transistor using one fin is j, a current amount of the fin-shaped transistor 109 using four fins F1a becomes 4j. In addition, a current amount of the fin-shaped transistor 109a may be approximately $4j+\alpha$ or $4j-\alpha$.

The fin-shaped transistors 108 and 108a use three fins F1b and F2b, respectively. A current amount of the fin-shaped transistor 108 using three fins F1b becomes 3j. In addition, a current amount of the fin-shaped transistor 108a may be approximately $3j+\alpha$ or $3j-\alpha$.

The fin-shaped transistors 107 and 107a uses two fins F1c and F2c, respectively. A current amount of the fin-shaped transistor 107 using two fins F2b becomes 2j. In addition, a current amount of the fin-shaped transistor 107a may be approximately $2j+\alpha$ or $2j-\alpha$.

The fin-shaped transistors 101 and 101a use one fin F1d and F2d, respectively. A current amount of the fin-shaped transistor 101 using one fin F1d becomes j. In addition, a current amount of the fin-shaped transistor 101a may be approximately $j+\alpha$ or $j-\alpha$. Therefore, according to the tenth embodiment, the fin-shaped transistors 109, 109a, 108, 108a, 107, 107a, 101 and 101a have different current amounts.

Figure 12:
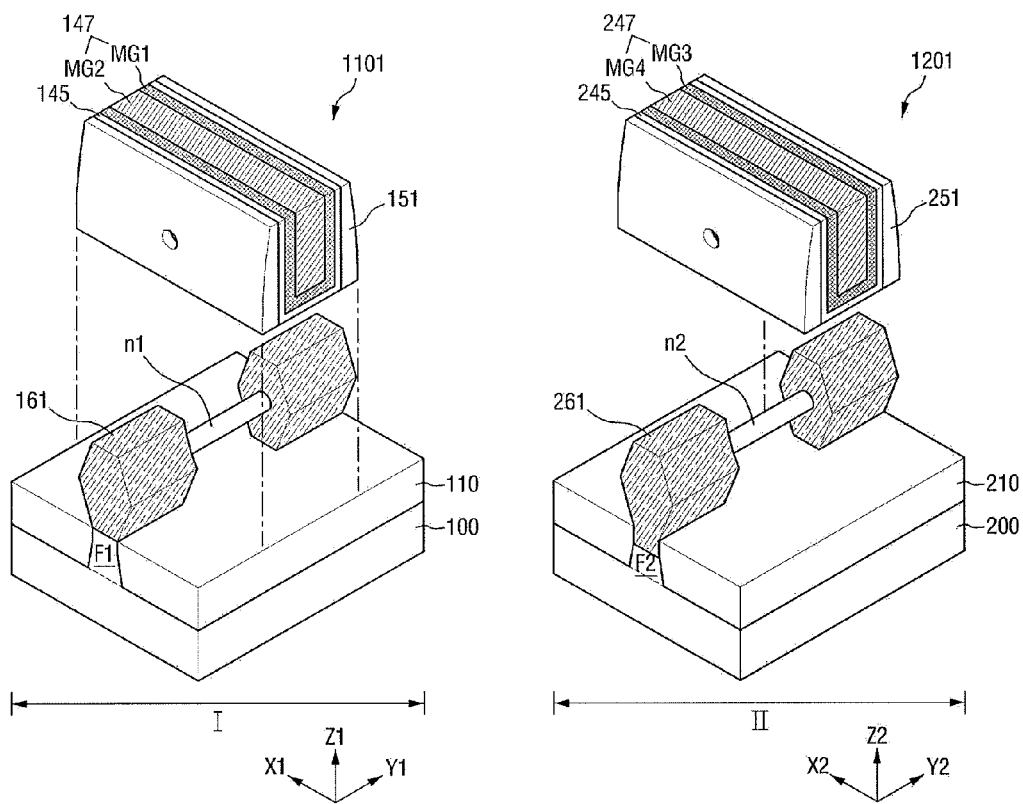
FIG. 12 illustrates an eleventh embodiment of an integrated circuit device.

FIG. 12 illustrates an eleventh embodiment of an integrated circuit device which includes a first nanowire-shaped transistor 1101 and a second nanowire-shaped transistor 1201. A nanowire-shaped transistor may also be referred to as a gate-all-around device. The first and second nanowire-shaped transistors 1101, 1201 use nanowires n1 and n2, instead of fins (e.g., F1 and F2 of FIGS. 1 to 3).

The first nanowire-shaped transistor 1101 may include a first nanowire n1, a first gate electrode 147 formed on the first nanowire n1 to intersect the first nanowire n1, and a first source/drain 161 formed in the first nanowire n1 at either side of the first gate electrode 147.

The second nanowire-shaped transistor 1201 may include a second nanowire n2, a second gate electrode 247 formed on the second nanowire n2 to intersect the second nanowire n2, and a second source/drain 261 formed in the second nanowire n2 at either side of the second gate electrode 247.

In the illustrated embodiment, cross-sectional shapes of the first and second nanowires n1 and n2 are circular. In other embodiments, the cross-sectional shapes of the first and second nanowires n1 and n2 may be oval, rectangular, square, or another shape. In one implementation, a thickness of a first source/drain 161 of the first nanowire-shaped transistor 1101 and a thickness of a second source/drain 261 of the second nanowire-shaped transistor 1201 may be different from each other.

Figure 13A:
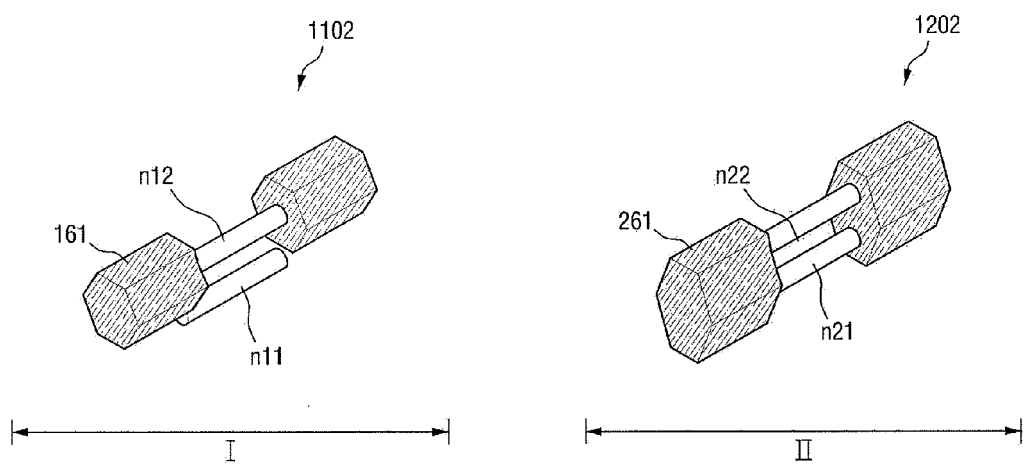
FIGS. 13A and 13B illustrate twelfth embodiments of integrated circuit.

FIG. 13A illustrates a conceptual diagram of a first arrangement (12a-th) of a twelfth embodiment of an integrated circuit device. In this arrangement, a first nanowire-shaped transistor 1102 and a second nanowire-shaped transistor 1202 include multiple nanowires n11, n12, n21 and n22 stacked vertically one on another. In the illustrated embodiment, two nanowires are stacked. In other embodiments, three or more nanowires may be stacked one on another.

In detail, the first nanowire-shaped transistor 1102 includes multiple first nanowires n11 and n12 stacked vertically. A first source/drain 161 is electrically connected to n first nanowires among the multiple first nanowires n11 and n12, where n is a natural number, e.g., 1. That is to say, only one first nanowire n12 may be used in this particular arrangement.

The second nanowire-shaped transistor 1202 includes multiple second nanowires n21 and n22 stacked vertically. A second source/drain 261 is electrically connected to m second nanowires among the multiple second nanowires n21 and n22, where m is a natural number different from n, e.g., 2. That is to say, two second nanowires n21 and n22 may be used in this particular arrangement.

The driving current amounts can be controlled by varying the number of nanowires n11, n12, n21, and n22 used. For example, a current amount of the first nanowire-shaped transistor 1102 using one nanowire may be j, and a current amount of the second nanowire-shaped transistor 1202 using two nanowires may be 2j.

Figure 13B:
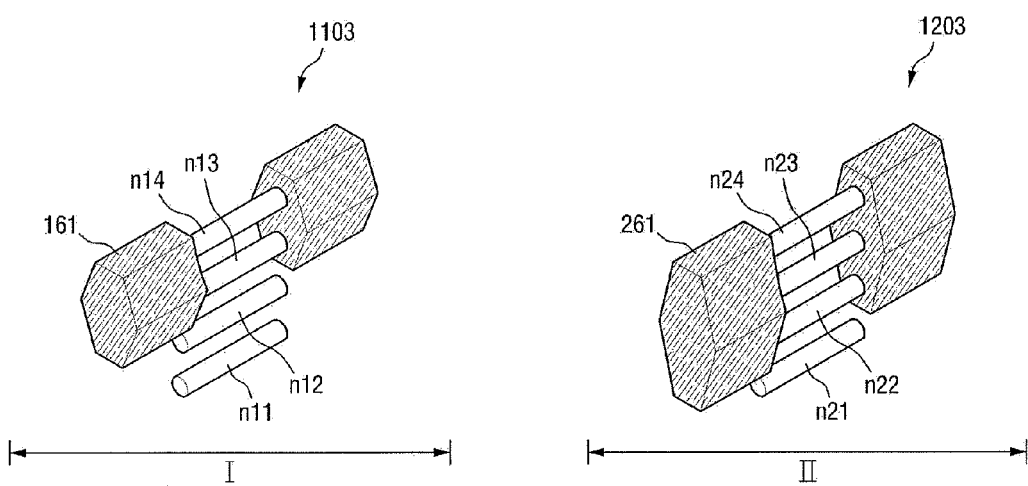

FIG. 13B illustrates a second arrangement (12b-th) of the twelfth embodiment of an integrated circuit device. Referring to FIG. 13B, a first nanowire-shaped transistor 1103 and a second nanowire-shaped transistor 1203 include three or more nanowires n11 to n14 and n21 to n24, respectively. The number of first nanowires n11 to n14 in the first nanowire-shaped transistor 1103 and the number of second nanowires n21 to n24 in the second nanowire-shaped transistor 1203 may be the same.

For example, the first nanowire-shaped transistor 1103 may include multiple first nanowires n11 to n14 stacked vertically. A first source/drain 161 may be electrically connected to n first nanowires among the multiple first nanowires n11 to n14, where n is a natural number, e.g., 2. Thus, only two first nanowires n13 and n14 may be used. The n first nanowires n11 to n14 may be sequentially arranged, with the topmost first nanowire corresponding to n14. In FIG. 13B, two first nanowires are used from the topmost first nanowire, that is, n14 and n13.

The second nanowire-shaped transistor 1203 includes multiple second nanowires n21 to n24 stacked vertically. A second source/drain 261 is electrically connected to m second nanowires among the multiple second nanowires n21 to n24, where m is a natural number, e.g., 3. That is to say, three second nanowires n22, n23 and n24 may be used. The m second nanowires n21 to n24 may be sequentially arranged, with the topmost second nanowire corresponding to n24. In FIG. 13B, three second nanowires n24, n23 and n22 are used.

The number of first nanowires n11 to n14 in the first nanowire-shaped transistor 1103 and the number of second nanowires n21 to n24 in the second nanowire-shaped transistor 1203 may be the same. In FIG. 13B, four of the first nanowires n11 to n14 and the second nanowires n21 to n24 are stacked.

The driving current amounts may be controlled by varying the number of nanowires n11 to n14 and n21 to n24 used. Assuming that a current amount of the first nanowire-shaped transistor 1102 using two nanowires is 2j, a current amount of the second nanowire-shaped transistor 1202 using three nanowires is 3j.

In the integrated circuit devices according to the first and second twelfth (12a-th and 12b-th) embodiments, the numbers of exposed nanowires may be made to be different from each other by varying depths of recesses in forming the first source/drain 161 and the second source/drain 261, thereby controlling the number of nanowires used.

FIGS. 14 to 26 illustrate one embodiment of a method of making an integrated circuit device. In FIGS. 14 to 20, only the first fin-shaped transistor (101 of FIG. 1) is exemplified because the operations for forming the first fin-shaped transistor 101 and the second fin-shaped transistor (201 of FIG. 1) may be substantially the same. In FIGS. 21 to 26, the first fin-shaped transistor 101 and the second fin-shaped transistor 201 are separately illustrated. FIGS. 22 and 25 are cross-sectional views taken along the line A-A of FIGS. 21 and 24, respectively. FIGS. 23 and 26 illustrate cross-sectional views taken along the lines B-B and C-C of FIG. 24, respectively.

Figure 14:
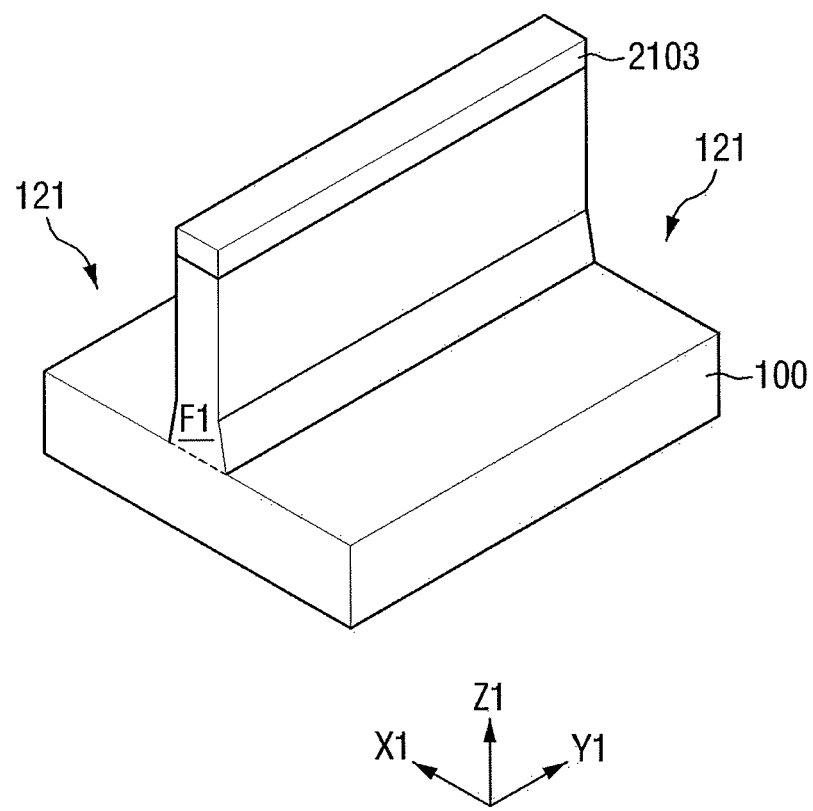
FIGS. 14 to 26 illustrate a first embodiment of a method for making an integrated circuit device 1.

Referring to FIG. 14, a first fin F1 is formed in a first region I. To form the first fin F1, a mask pattern 2103 is formed on a substrate 100. An etching process is then performed to form the first fin F1. The first fin F1 may extend in a second direction Y1. The trench 121 is formed around the first fin F1. The mask pattern 2103 may be made of at least one material selected from the group consisting of silicon oxide, silicon nitride, and silicon oxynitride.

Figure 15:
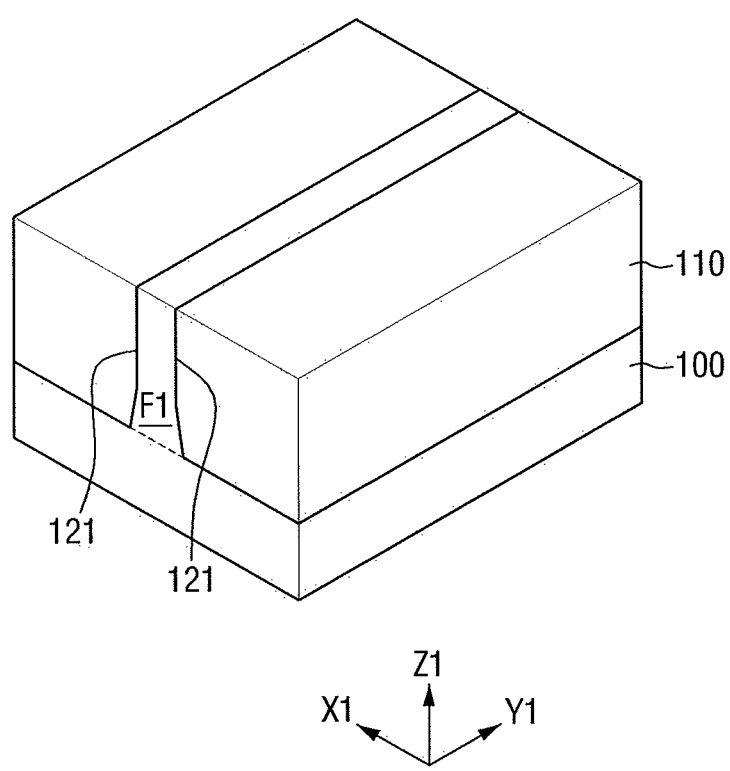

Referring to FIG. 15, an isolation film 110 filling the trench 121 is formed. The isolation film 110 may be made of at least one material selected from the group consisting of silicon oxide, silicon nitride, and silicon oxynitride.

Figure 16:
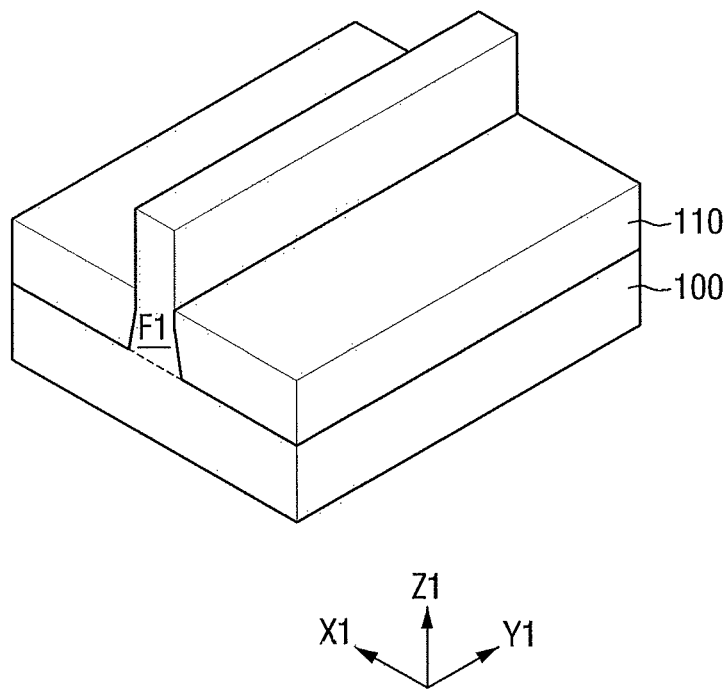

Referring to FIG. 16, a top portion of the isolation film 110 is recessed to expose a top portion of the first fin F1. The recessing may include a selective etching process. The mask pattern 2103 may be removed before forming the isolation film 110 or after performing the recess process.

Meanwhile, a portion of the first fin F1 protruding above the isolation film 110 may be formed by an epitaxial process. More specifically, after forming the isolation film 110, a portion of the first fin F1 may be formed by an epitaxial process using a top surface of the first fin F1 exposed by the isolation film 110 and without a recess process as a seed.

In addition, doping for adjusting a threshold voltage may be performed on the first fin F1. In a case where the fin-shaped transistor 101 is an NMOS transistor, the impurity doped may be boron (B). In a case where the fin-shaped transistor 101 is a PMOS transistor, the impurity doped may be phosphorus (P) or arsenic (As).

Figure 17:
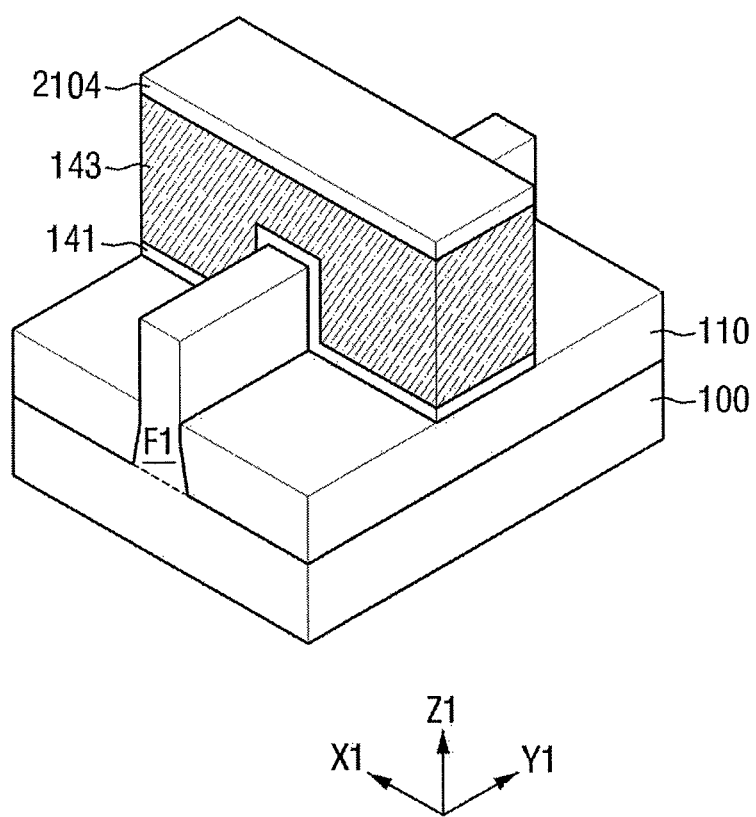

Referring to FIG. 17, an etching process is performed using the mask pattern 2104, to thereby form a dummy gate insulation layer 141 and a first dummy gate electrode 143 extending in a first direction X1 and intersecting or overlapping the first fin F1. For example, the dummy gate insulation layer 141 may include silicon oxide, and the first dummy gate electrode 143 may include polysilicon.

Figure 18:
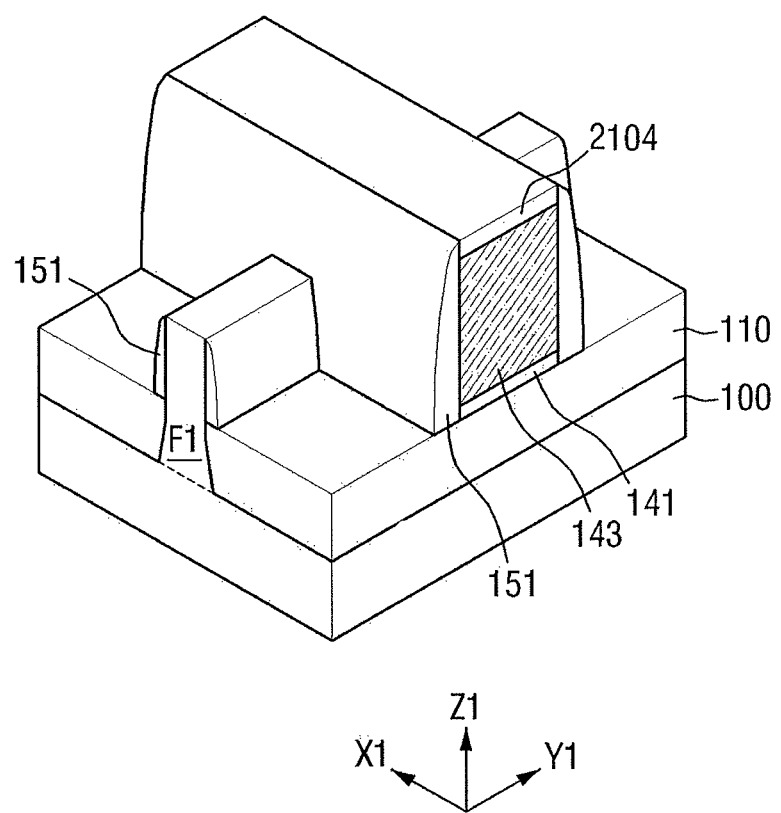

Referring to FIG. 18, a first spacer 151 is formed on sidewalls of the first dummy gate electrode 143 and sidewalls of the first fin F1. For example, an insulation layer is formed on the resultant product having the first dummy gate electrode 143 formed thereon. An etch-back process may then be performed, to thereby form the first spacer 151. The first spacer 151 may expose the top surface of the mask pattern 2104 and the top surface of the first fin F1. The first spacer 151 may include silicon nitride or silicon oxynitride.

Figure 19:
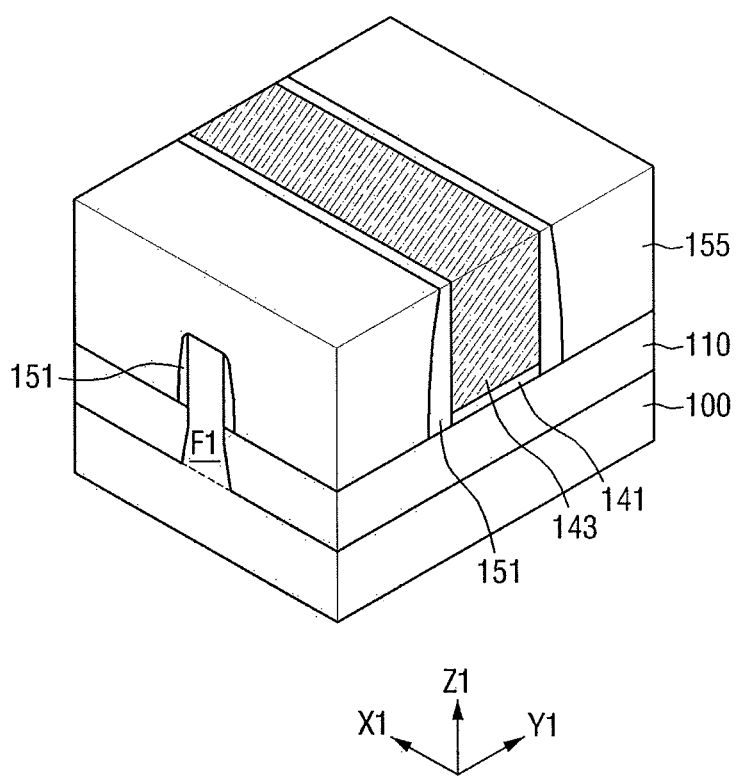

Referring to FIG. 19, an interlayer insulation layer 155 is formed on the resultant product having the first spacer 151 formed thereon. The interlayer insulation layer 155 may include silicon oxide. The interlayer insulation layer 155 may be planarized until the top surface of the first dummy gate electrode 143 is exposed. As the result, the mask pattern 2104 may be removed, and the top surface of the first dummy gate electrode 143 may be exposed.

Figure 20:
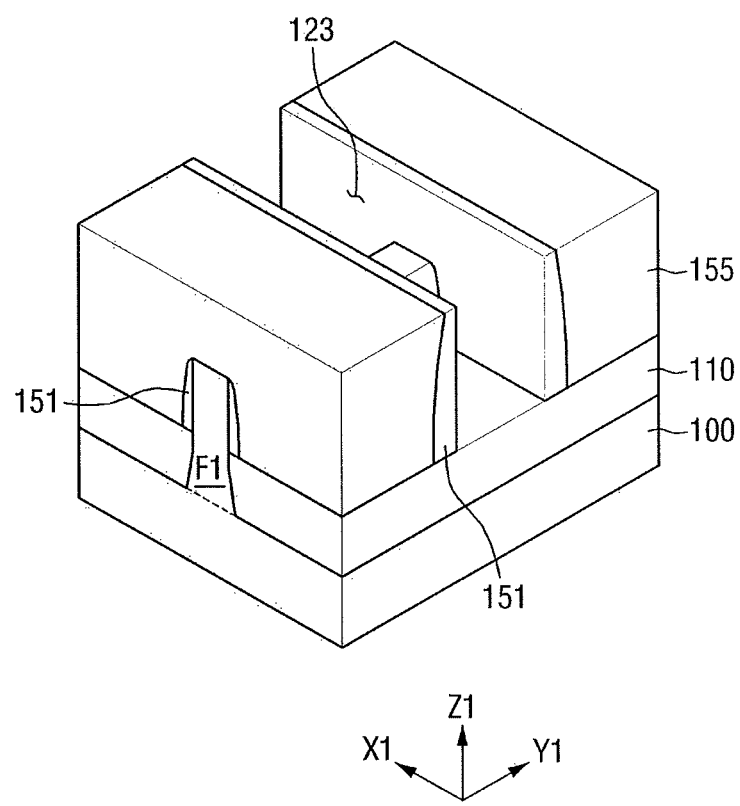

Referring to FIG. 20, the dummy gate insulation layer 141 and the first dummy gate electrode 143 are removed. As the dummy gate insulation layer 141 and the first dummy gate electrode 143 are removed, a trench 123 exposing the isolation film 110 is formed.

Figure 21:
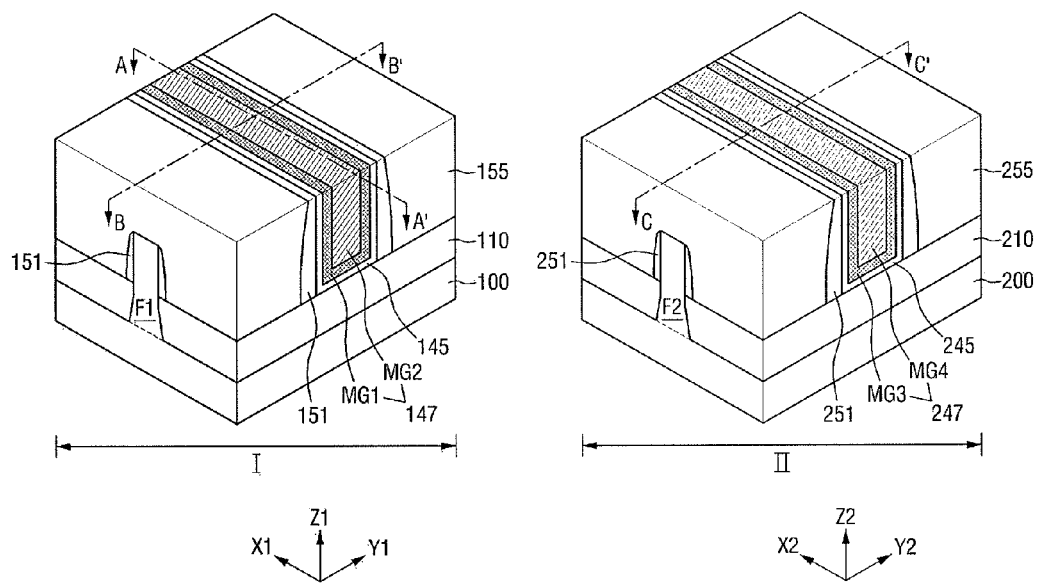
Figure 22:
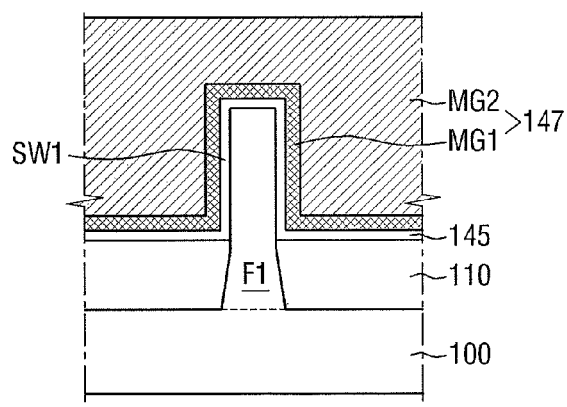
Figure 23:
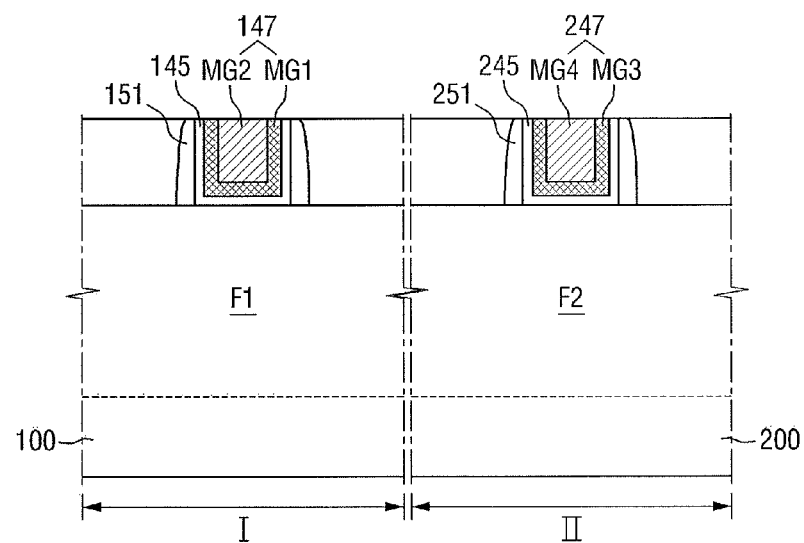

Referring to FIGS. 21 to 23, the first gate insulation layer 145 and the first gate electrode 147 are formed in the trench 123. The first gate insulation layer 145 may include a high-k material having a higher dielectric constant than silicon oxide. For example, the first gate insulation layer 145 may include HfO2, ZrO2 or Ta2O5. The first gate insulation layer 145 may be substantially conformally formed along sidewalls and bottom surface of the trench 123.

The first gate electrode 147 may include metal layers MG1 and MG2. As shown, the first gate electrode 147 may include two or more metal layers MG1 and MG2 stacked. The first metal layer MG1 may function to adjust a work function, and the second metal layer MG2 may function to fill a space formed by the first metal layer MG1. For example, the first metal layer MG1 may include at least one of TiN, TaN, TiC, or TaC. The second metal layer MG2 may include W or Al. Alternatively, the first gate electrode 147 may include a material other than a metal, such as Si or SiGe.

In the same manner as described above, a second gate insulation layer 245 and a second gate electrode 247 are formed in a second region II. The second gate electrode 247 may include metal layers MG3 and MG4.

Figure 24:
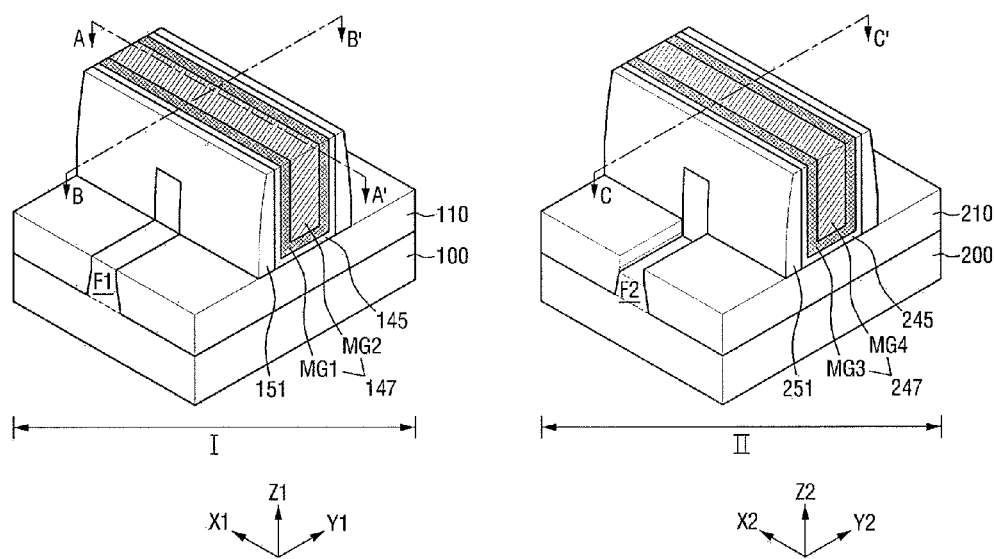
Figure 25:
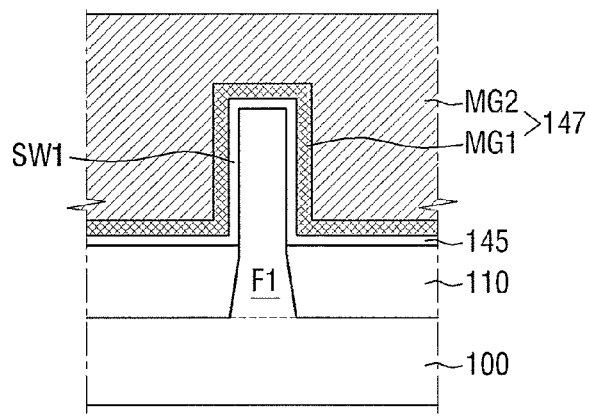
Figure 26:
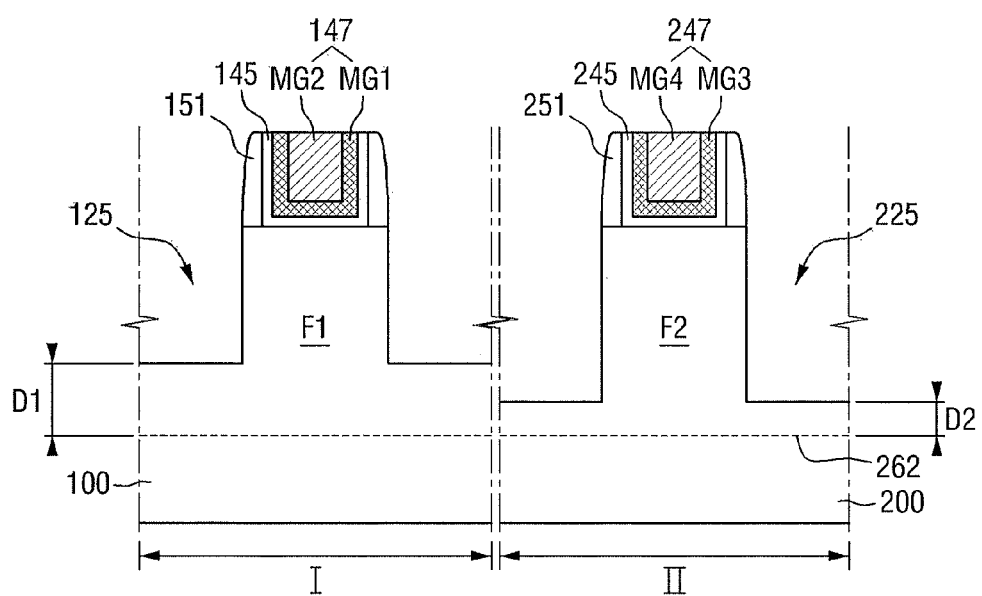

Referring to FIGS. 24 to 26, in the first region I, a first recess 125 is formed in a first fin F1 at either side of the first gate electrode 147. In the second region II, a second recess 225 is formed in a second fin F2 at either side of the second gate electrode 247. For the recesses, a depth of the first recess 125 of the first fin-shaped transistor 101 may be different from a depth of the second recess 225 of the second fin-shaped transistor 201.

The processes of forming the first recess 125 and forming of the second recess 225 may be separately performed. For example, etching may be performed using a first mask which exposes the first region I, but which does not expose the second region II. Thereafter, etching may be performed using a second mask which exposes the second region II, but which does not expose the first region I. The etching may be, for example, dry etching or a combination of wet etching and dry etching.

Referring again to FIGS. 1 to 3, the first source/drain 161 is formed in the first recess 125 and the second source/drain 261 is formed in the second recess 225. For example, the first source/drain 161 may be an elevated source/drain. In addition, the first source/drain 161 and second source/drain 261 may be performed by an epitaxial process. In addition, materials of the first source/drain 161 and the second source/drain 261 may vary according to whether the first fin-shaped transistor 101 and the second fin-shaped transistor 201 are PMOS transistors or NMOS transistors. Impurities may be in-situ doped during the epitaxial process. Also, the first recess 125 and the second recess 225 may be filled with a metal, instead of a semiconductor material.

Figure 27:
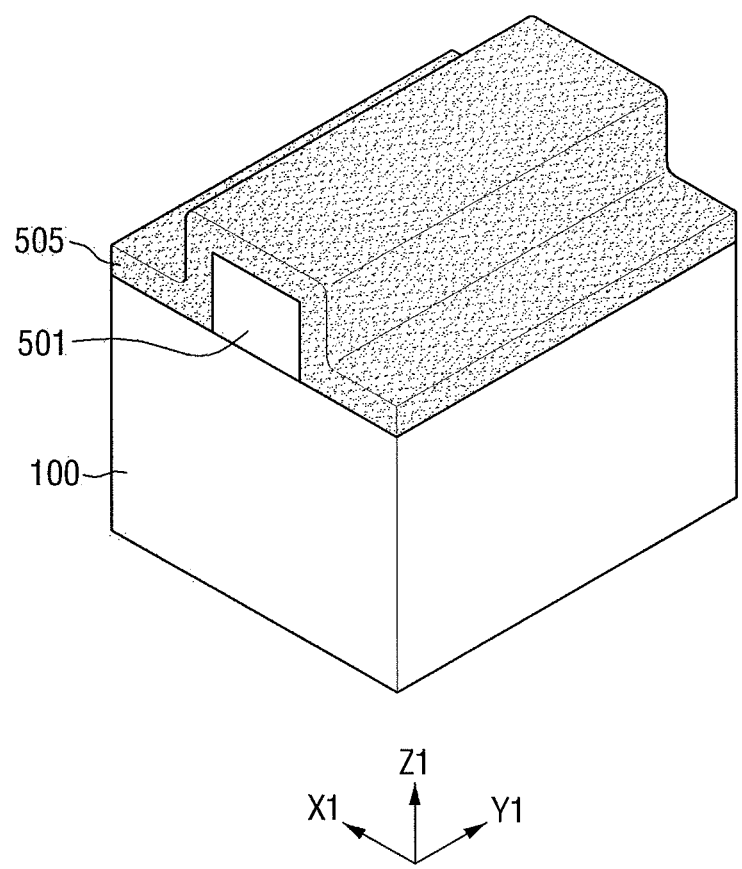
FIGS. 27 to 29 illustrate a method for forming fins that can be used in a method for making integrated circuit devices.
Figure 28:
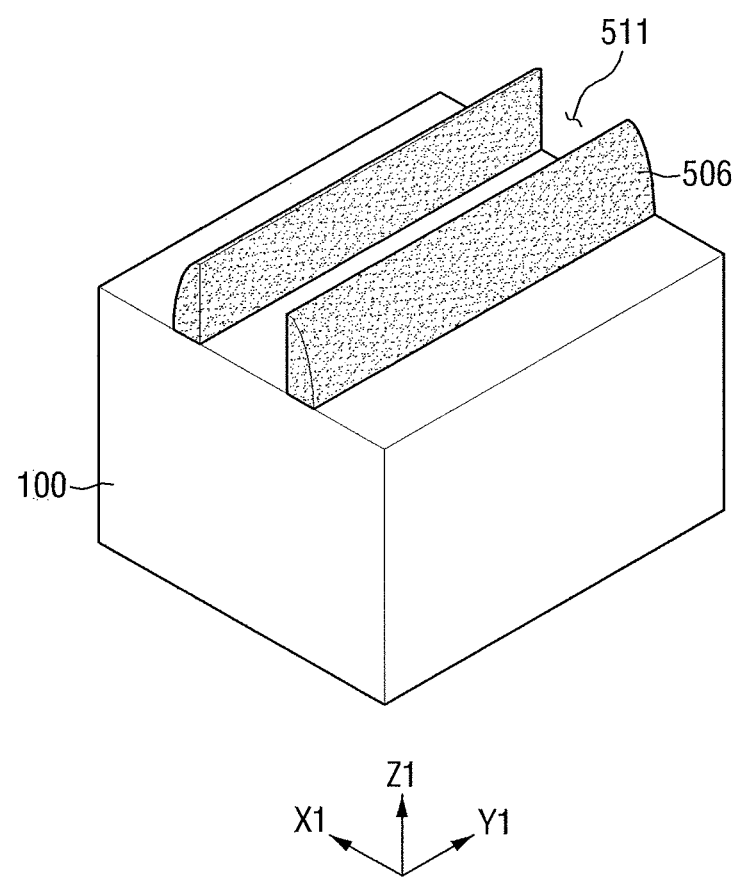
Figure 29:
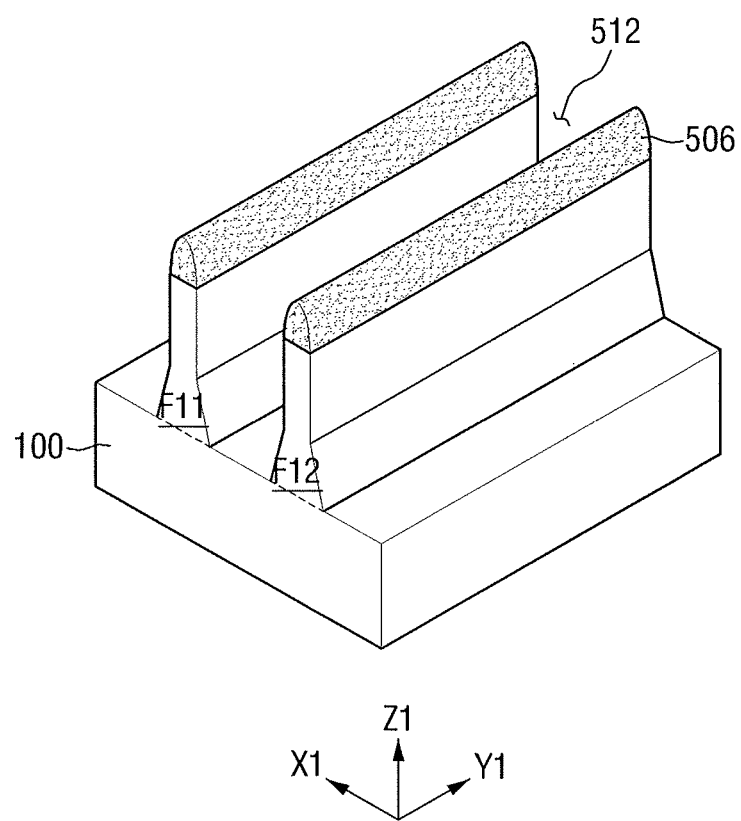

FIGS. 27 to 29 describe an embodiment of a method for forming fins that can be used in the fabrication of one or more of the aforementioned embodiments of the integrated circuit devices. The method described in FIGS. 27 to 29 may include a method for forming multiple fins shown in FIG. 11A, for example, a sidewall image transfer (SIT) process. FIGS. 27 to 29 illustrate a method of two fins by way of example, this embodiment may be analogously applied to forming a different numbers of fins in other embodiments.

Referring to FIG. 27, a sacrificial pattern 501 is formed on a substrate 100. Next, a mask layer 505 is formed on the substrate 100 having the sacrificial pattern 501 formed thereon. The mask layer 505 may be conformally formed along the top surface of the substrate 100 having the sacrificial pattern 501 thereon. The sacrificial pattern 501 and the mask layer 505 may be made of materials having etching selectivity to each other. For example, the mask layer 505 may include at least one selected from the group consisting of silicon oxide, silicon nitride, silicon oxynitride, photo resist, spin on glass (SOG), and spin on hard mask (SOH). The sacrificial pattern 501 may be made of a material such as any of those listed above, which is different from the material forming the mask layer 505.

In addition, the sacrificial pattern 501 and the mask layer 505 may be formed by a method selected from the group consisting of a physical vapor deposition process (PVD), a chemical vapor deposition process (CVD), an atomic layer deposition (ALD) and spin coating.

Referring to FIG. 28, spacer-shaped mask patterns 506 are formed on sidewalls of the sacrificial pattern 501 using an etch-back process. Next, the sacrificial pattern 501 is removed. The mask patterns 506 have substantially the same width. A trench 511 may be formed between the mask patterns 506.

Referring to FIG. 29, the substrate 100 is etched using the mask patterns 506 as etch masks substrate 100. As the result, fins F11 and F12 having a constant width may be formed. A trench 512 may be formed between the fins F11 and F12 adjacent to each other by an etching process. With the etching process, top portions of the mask patterns 506 are etched together, to thereby provide mask patterns 506 having rounded top portions. Then, the mask patterns 506 are removed, thereby completing fins F11 and F12 which are spaced apart from each other and have a constant width.

Figure 30:
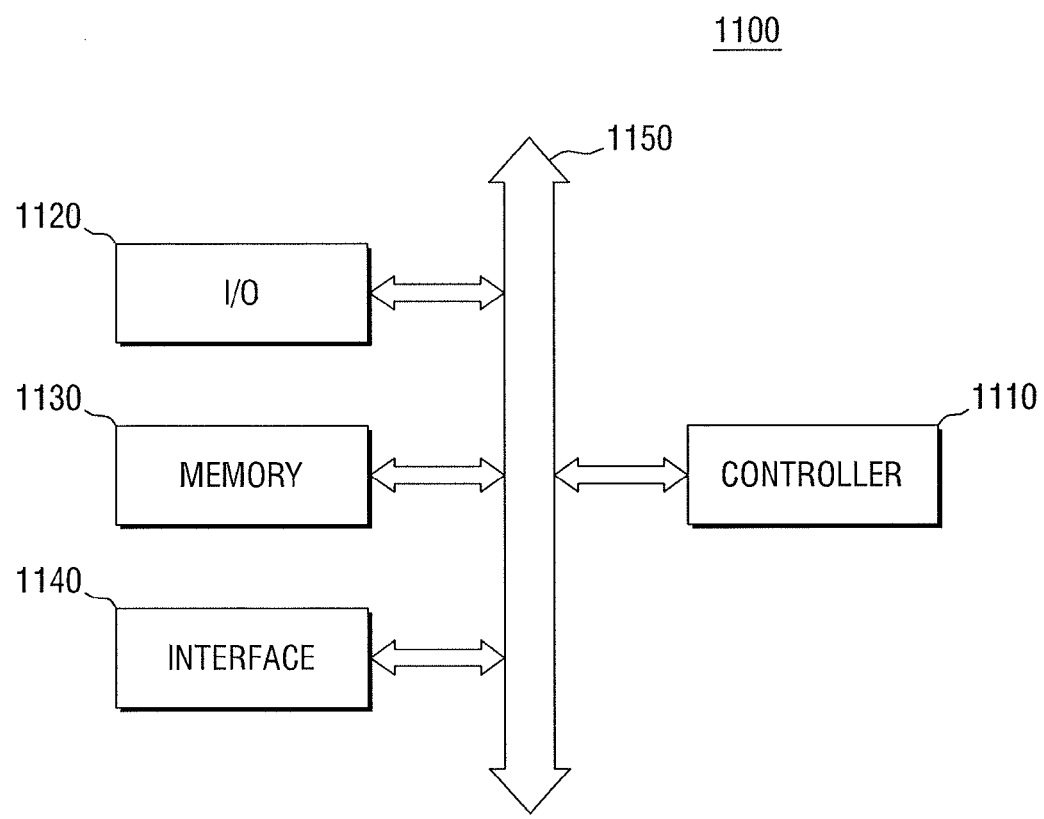
FIG. 30 illustrates an embodiment of an electronic system including any of the aforementioned embodiments of an integrated circuit device.

FIG. 30 illustrates an embodiment of an electronic system including an integrated circuit device corresponding to any of the aforementioned embodiments. Referring to FIG. 30, the electronic system 1100 may include a controller 1110, an input/output device (I/O) 1120, a memory device 1130, an interface 1140, and a bus 1150. The controller 1110, the I/O 1120, the memory device 1130, and/or the interface 1140 may be connected to each other through the bus 1150. The bus 1150 corresponds to a path through which data moves.

The controller 1110 may include at least one of a microprocessor, a digital signal processor, a microcontroller, and logic elements capable of functions similar to those of these elements. The I/O 1120 may include a keypad, a keyboard, a display device, and so on. The memory device 1130 may store data and/or codes. The interface 1140 may perform functions of transmitting data to a communication network or receiving data from the communication network. The interface 1140 may be wired or wireless. For example, the interface 1140 may include an antenna or a wired/wireless transceiver, and so on.

The electronic system 1100 may further include high-speed DRAM and/or SRAM as the operating memory for improving the operation of the controller 1110. Fin-type FETs according to the embodiments described herein may be incorporated into the memory device 1130 or provided as part of the controller 1110 or the I/O 1120.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 31:
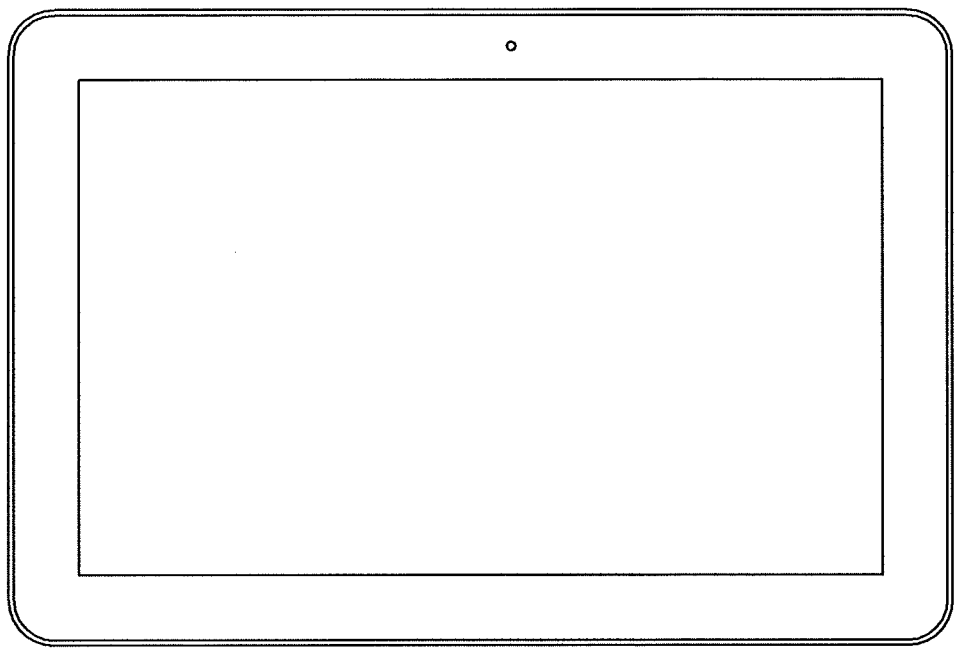
FIGS. 31 and 32 illustrate an embodiment of a semiconductor system including any one of the aforementioned embodiments of an integrated circuit device.
Figure 32:
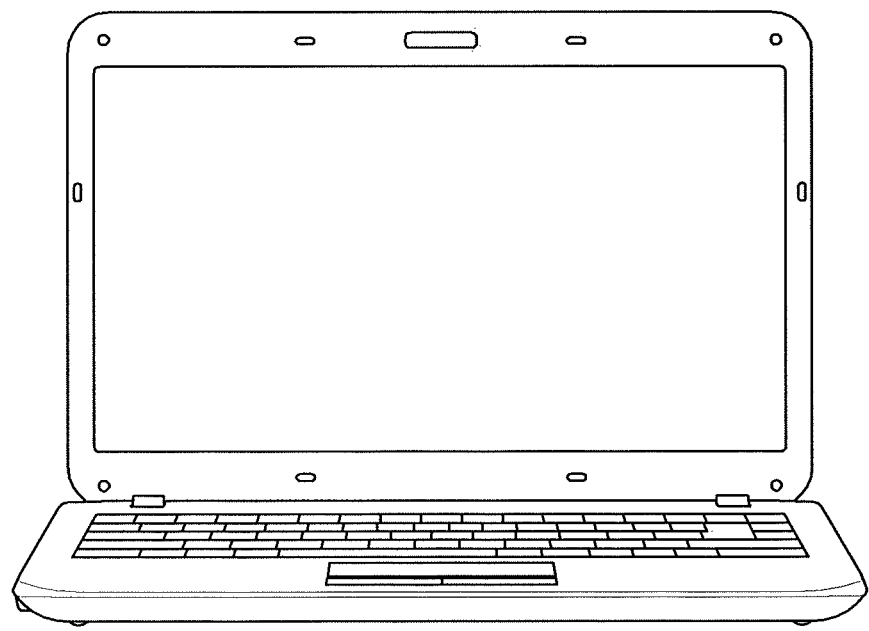

FIGS. 31 and 32 illustrate embodiments of a semiconductor system which may include any of the aforementioned embodiments of the integrated circuit device. FIG. 31 illustrates an example in which the integrated circuit device is applied to a tablet PC. FIG. 32 illustrates an example in which the integrated circuit device is applied to a notebook computer. At least one of the integrated circuit devices may be used for a tablet PC, a notebook computer, smart phone, media player, pad- or pod-type device, or another type of communication device and/or information processing system.

In accordance with one or more embodiments, an integrated circuit device is provided which can control current amount by adjusting a thickness of source/drain and/or other device parameters. Also, embodiments of a method for making integrated circuit devices are provided which can control a current amount by adjusting a thickness of source/drain and/or other device parameters.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A device, comprising:
a first fin-shaped transistor on a substrate; and
a second fin-shaped transistor on the substrate, wherein:
a first source/drain of the first fin-shaped transistor has a first thickness, a second source/drain of the second fin-shaped transistor has a second thickness different from the first thickness, and
lower surfaces of the first source/drain and the second source/drain are higher than an upper surface of the substrate, wherein
an impurity concentration of the first source/drain is different from an impurity concentration of the second source/drain such that the impurity concentration difference between the first source/drain and the second source/drain causes a driving current difference between the first fin-shaped transistor and the second fin-shaped transistor.

2. The device as claimed in claim 1, wherein:
a first distance ranges from a first bottom of a first fin of the first fin-shaped transistor to a first interface between the first fin and the first source/drain,
a second distance ranges from a second bottom of a second fin of the second fin-shaped transistor to a second interface between the second fin and second source/drain, and
the first distance and the second distance are different.

3. The device as claimed in claim 1, wherein:
the first source/drain and the second source/drain have substantially a same first lattice constant, and
a first stress applied by the first source/drain to a first channel of the first fin-shaped transistor is different from a second stress applied by the second source/drain to a second channel of the second fin-shaped transistor.

4. The device as claimed in claim 3, wherein the first channel and the second channel have substantially a same second lattice constant different from the first lattice constant.

5. The device as claimed in claim 3, wherein
the first fin-shaped transistor and the second fin-shaped transistor are PMOS transistors,
the first source/drain and the second source/drain include SiGe, and
the first channel and the second channel include Si.

6. The device as claimed in claim 3, wherein:
the first fin-shaped transistor and the second fin-shaped transistor are NMOS transistors, and
the first source/drain and the second source/drain include SiC, the first channel and the second channel include Si.

7. The device as claimed in claim 1, wherein
the first source/drain of the first fin-shaped transistor is directly on the substrate, and
the second source/drain of the second fin-shaped transistor is directly on the substrate.

8. A device, comprising:
a first transistor on a substrate, the first transistor having a first fin including a first channel between first source/drain regions; and
a second transistor on the substrate, the second transistor having a second fin including a second channel between second source/drain regions; wherein:
the first and second channels have fixed channel widths, lower surfaces of the first and second source/drain regions are higher than an upper surface of the substrate, and
the first transistor operates based on a first amount of current and the second transistor operates based on a second amount of current different from the first amount of current, wherein
an impurity concentration of the first source/drain regions are different from an impurity concentration of the second source/drain regions such that the impurity concentration difference between the first source/drain regions and the second source/drain regions causes a difference between the first and second amounts of currents.

9. The device as claimed in claim 8, wherein:
the first source/drain regions apply a first force to the first channel in the first fin, and
the second source/drain regions apply a second force to the second channel in the second fin, wherein the first force is different from the second force, a difference between the first and second forces corresponding to the difference between the first and second amounts of currents.

10. The device as claimed in claim 9, wherein:
the first source/drain regions apply the first force to the first channel based on the impurity concentration of the first source/drain regions, and
the second source/drain regions apply the second force to the second channel based on the impurity concentration of the second source/drain regions.

11. The device as claimed in claim 9, wherein:
the first source/drain regions apply the first force to the first channel based on a first size of the first source/drain regions, and
the second source/drain regions apply the second force to the second channel based on a second size of the second source/drain regions different from the first size.

12. The device as claimed in claim 11, wherein the first and second sizes are different thicknesses.

13. The device as claimed in claim 8, wherein:
the first transistor has a first number of first fins, and
the second transistor has a second number of second fins different from the first number of fins, wherein
the first number is at least one, and wherein:
the first number of fins corresponds to the first amount of current, and
the second number of fins corresponds to the second amount of current.

14. The device as claimed in claim 8, wherein
the first transistor has a first number of nanowires which includes the first channel, and the second transistor has a second number of nanowires which includes a second channel, wherein
the first number of nanowires is at least one, and wherein:
the first amount of current is based on the first number of nanowires, and
the second amount of current is based on the second number of nanowires.

\* \* \* \* \*